(12) United States Patent
Park et al.

(10) Patent No.: US 12,453,128 B2
(45) Date of Patent: Oct. 21, 2025

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Sung Il Park, Suwon-si (KR); Jae Hyun Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 524 days.

(21) Appl. No.: 17/935,222

(22) Filed: Sep. 26, 2022

(65) Prior Publication Data

US 2023/0261078 A1     Aug. 17, 2023

(30) Foreign Application Priority Data

Feb. 15, 2022  (KR) .................. 10-2022-0019355

(51) Int. Cl.
*H01L 29/423* (2006.01)
*H01L 23/48* (2006.01)
(Continued)

(52) U.S. Cl.
CPC ........ *H10D 30/6735* (2025.01); *H01L 23/481* (2013.01); *H10D 30/6757* (2025.01);
(Continued)

(58) Field of Classification Search
CPC ........... H10D 30/6735; H10D 30/6757; H10D 62/121; H10D 84/856; H10D 88/00; H10D 30/014; H10D 30/43; H10D 30/47; H10D 30/675; H10D 62/292; H10D 62/80; H10D 62/882; H10D 64/017; H10D 64/512; H10D 62/117; H10D 84/0186; H10D 84/038; H10D 84/85; H10D 88/01; H10D 30/67; H10D 84/853; H10D 84/834; H01L 23/481; H01L 21/76895
(Continued)

(56) References Cited

U.S. PATENT DOCUMENTS 10,388,732 B1   8/2019  Frougier et al.
10,727,230 B2   7/2020  Peng et al.
(Continued)

*Primary Examiner* — Tong-Ho Kim
(74) *Attorney, Agent, or Firm* — MORGAN, LEWIS & BOCKIUS LLP

(57) ABSTRACT

A semiconductor device having high performance and a high degree of integration includes a substrate, a first transistor disposed on the substrate, the first transistor comprising a first active pattern including a first two-dimensional semiconductor material, a first gate electrode through which the first active pattern penetrates, and a first source/drain contact connected to the first active pattern on a side surface of the first gate electrode, a second transistor disposed on an upper surface of the first transistor, the second transistor comprising a second active pattern including a second two-dimensional semiconductor material, a second gate electrode through which the second active pattern penetrates, and a second source/drain contact connected to the second active pattern on a side surface of the second gate electrode, and a first wiring structure interposed between the first transistor and the second transistor, and electrically connecting the first transistor and the second transistor.

19 Claims, 22 Drawing Sheets

(51) Int. Cl.
    *H01L 27/06*     (2006.01)
    *H01L 27/092*     (2006.01)
    *H01L 29/06*     (2006.01)
    *H01L 29/786*     (2006.01)
    *H10D 30/67*     (2025.01)
    *H10D 62/10*     (2025.01)
    *H10D 84/85*     (2025.01)
    *H10D 88/00*     (2025.01)

(52) U.S. Cl.
    CPC ......... H10D 62/121 (2025.01); H10D 84/856 (2025.01); H10D 88/00 (2025.01)

(58) Field of Classification Search
    USPC ........................................... 257/401
    See application file for complete search history.

(56) References Cited

U.S. PATENT DOCUMENTS

| | | |
|---|---|---|
| 10,879,352 B2 | 12/2020 | Zhang et al. |
| 11,069,819 B2 | 7/2021 | Frougier |
| 11,121,044 B2 | 9/2021 | Cheng et al. |
| 11,158,544 B2 | 10/2021 | Cheng et al. |
| 2017/0162654 A1* | 6/2017 | Maeda ............... H10D 62/8503 |
| 2020/0075592 A1 | 3/2020 | Liebmann et al. |
| 2020/0295127 A1 | 9/2020 | Mannebach et al. |
| 2021/0135015 A1* | 5/2021 | Frougier ............. H10D 62/292 |
| 2021/0296445 A1 | 9/2021 | Lee et al. |

\* cited by examiner

SEMICONDUCTOR DEVICE AND METHOD FOR FABRICATING THE SAME

CROSS-REFERENCE

This application claims priority under 35 U.S.C. § 119 to Korean Patent Application No. 10-2022-0019355 filed on Feb. 15, 2022 in the Korean Intellectual Property Office, the disclosure of which is herein incorporated by reference in its entirety.

TECHNICAL FIELD

The present disclosure relates to a semiconductor device and a method for fabricating the same. More specifically, the present disclosure relates to a semiconductor device using a two-dimensional semiconductor material as a channel, and a method for fabricating the device.

DISCUSSION

Using scalable technology for increasing a density of an integrated circuit device, a multi-gate transistor, including a silicon body having a fin or nanowire shape, may be formed on a substrate, and a gate may be formed on a surface of the silicon body.

Since such a multi-gate transistor utilizes a three-dimensional channel, scaling is easily performed. Further, even if a gate length of the multi-gate transistor is not increased, current control capability may be improved. Furthermore, a short channel effect (SCE), in which potential of a channel region is influenced by a drain voltage, may be effectively suppressed.

On the other hand, a semiconductor device in which a two-dimensional semiconductor material is used as a channel may be used for improving mobility, suppressing the short channel effect (SCE) and the like, to enhance the performance of the semiconductor device.

SUMMARY

Embodiments of the present disclosure may provide a semiconductor device having high performance and a high degree of integration.

Embodiments of the present disclosure may also provide a method for fabricating a semiconductor device having high performance and a high degree of integration.

However, embodiments of the present disclosure are not restricted to the descriptive examples set forth herein. The above and other embodiments of the present disclosure will become more apparent to those of ordinary skill in the art to which the present disclosure pertains by referencing the detailed description of the present disclosure as provided below.

According to an embodiment of the present disclosure, there is provided a semiconductor device comprising a substrate, a first transistor disposed on the substrate, the first transistor comprising a first active pattern including a first two-dimensional semiconductor material, a first gate electrode through which the first active pattern penetrates, and a first source/drain contact connected to the first active pattern on a side surface of the first gate electrode, a second transistor disposed on an upper surface of the first transistor, the second transistor comprising a second active pattern including a second two-dimensional semiconductor material, a second gate electrode through which the second active pattern penetrates, and a second source/drain contact connected to the second active pattern on a side surface of the second gate electrode, and a first wiring structure interposed between the first transistor and the second transistor, and electrically connecting the first transistor and the second transistor.

According to an embodiment of the present disclosure, there is provided a semiconductor device comprising a substrate, a first etch blocking film which covers an upper surface of the substrate, a first transistor disposed on the first etch blocking film, a first wiring structure electrically connected to the first transistor, disposed on the first transistor, a second etch blocking film which covers at least a part of an upper surface of the first wiring structure, a second transistor having a conductive type different from that of the first transistor, disposed on the second etch blocking film, a second wiring structure electrically connected to the second transistor, disposed on the second transistor, and a through via which penetrates the second etch blocking film and electrically connects the first wiring structure and the second wiring structure, wherein the first transistor comprises a first active pattern including a first two-dimensional semiconductor material, a first gate electrode through which the first active pattern penetrates, and a first contact and a second contact each connected to both ends of the first active patterns on both side surfaces of the first gate electrode, and wherein the second transistor comprises a second active pattern including a second two-dimensional semiconductor material, a second gate electrode through which the second active pattern penetrates, and a third contact and a fourth contact each connected to both ends of the second active pattern on both side surfaces of the second gate electrode.

According to an embodiment of the present disclosure, there is provided a semiconductor device comprising a substrate, a first CMOS circuit which is sequentially stacked on the substrate, and includes a first transistor and a second transistor having different conductive types from each other, and a second CMOS circuit which is sequentially stacked on the first CMOS circuit, and includes a third transistor and a fourth transistor having different conductive types from each other, wherein each of the first to fourth transistors has an active pattern including a two-dimensional semiconductor material, a gate electrode through which the active pattern penetrates, and a first source/drain contact and a second source/drain contact each connected to both ends of the active pattern on both side surfaces of the gate electrode, and the first CMOS circuit and the second CMOS circuit are electrically connected.

BRIEF DESCRIPTION OF THE DRAWINGS

The above and other embodiments of the present disclosure will become more apparent by describing in detail exemplary embodiments thereof with reference to the attached drawings, in which.

DETAILED DESCRIPTION

In the present disclosure, although terms such as first and second may be used to describe various elements or components, it goes without saying that these elements or components are not limited by these terms. These terms are used to distinguish a single element or component from other elements or components. Therefore, it goes without saying that a first element or component referred below may be a second element or component within the technical idea of the present disclosure.

Hereinafter, a semiconductor device according to an exemplary embodiment will be described while referring to FIGS. 1 to 17.

Figure 1:
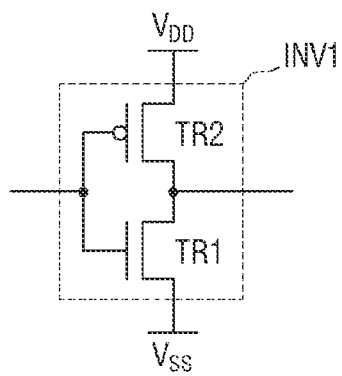
FIG. 1 is an exemplary circuit diagram for explaining a semiconductor device according to an embodiment.
Figure 2:
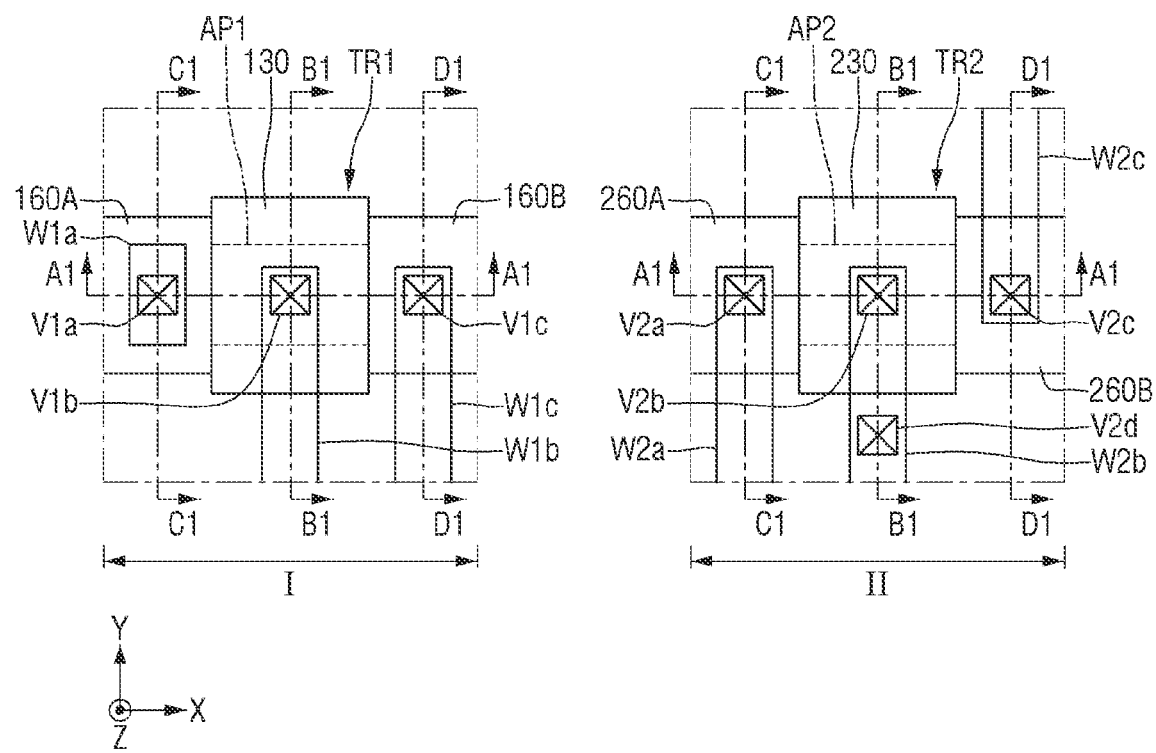
FIG. 2 is an exemplary layout diagram for explaining the semiconductor device of FIG. 1.
Figure 3:
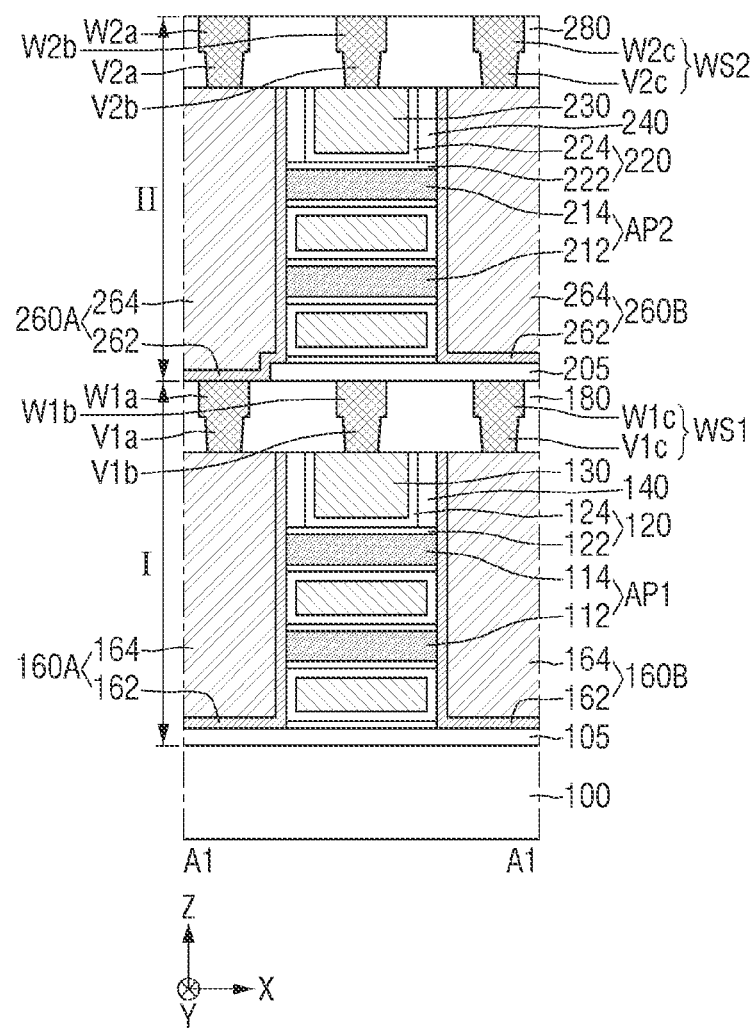
FIG. 3 is a cross-sectional view taken along A1-A1 of FIG. 2.
Figure 4:
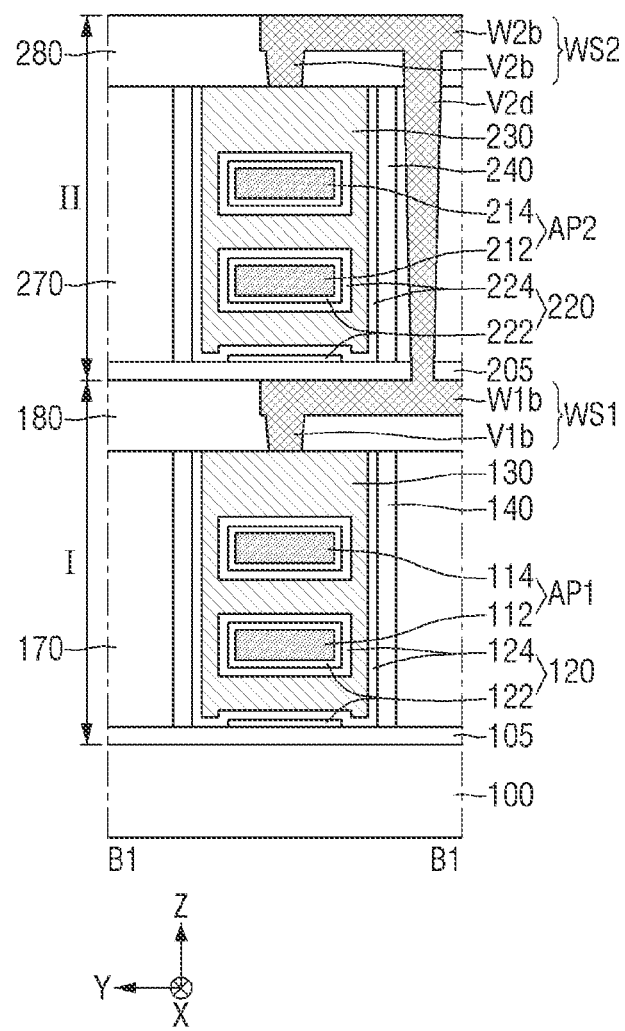
FIG. 4 is a cross-sectional view taken along line B1-B1 of FIG. 2.
Figure 5:
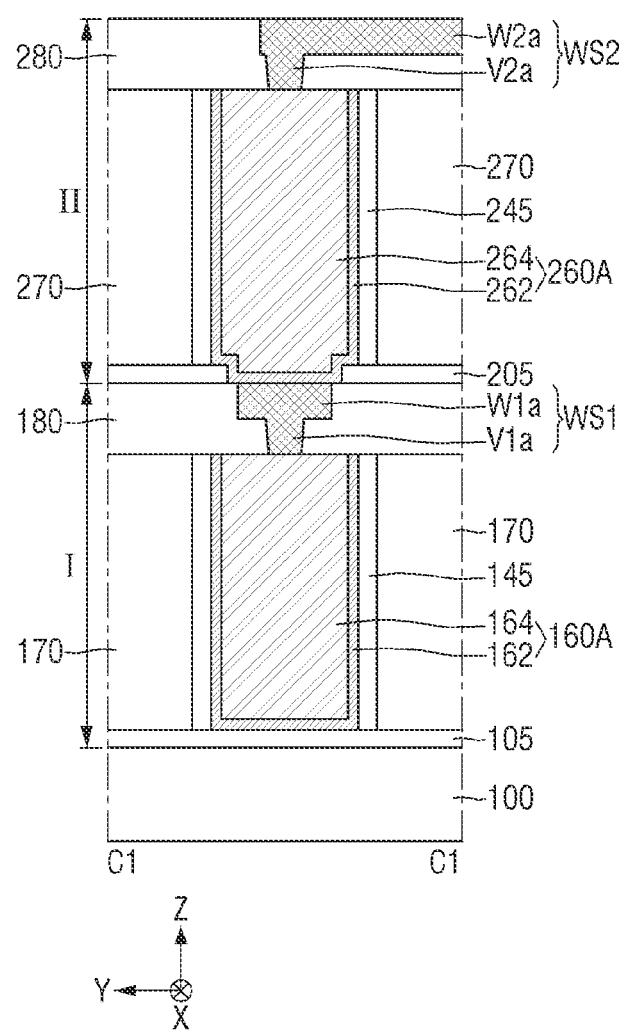
FIG. 5 is a cross-sectional view taken along C1-C1 of FIG. 2.
Figure 6:
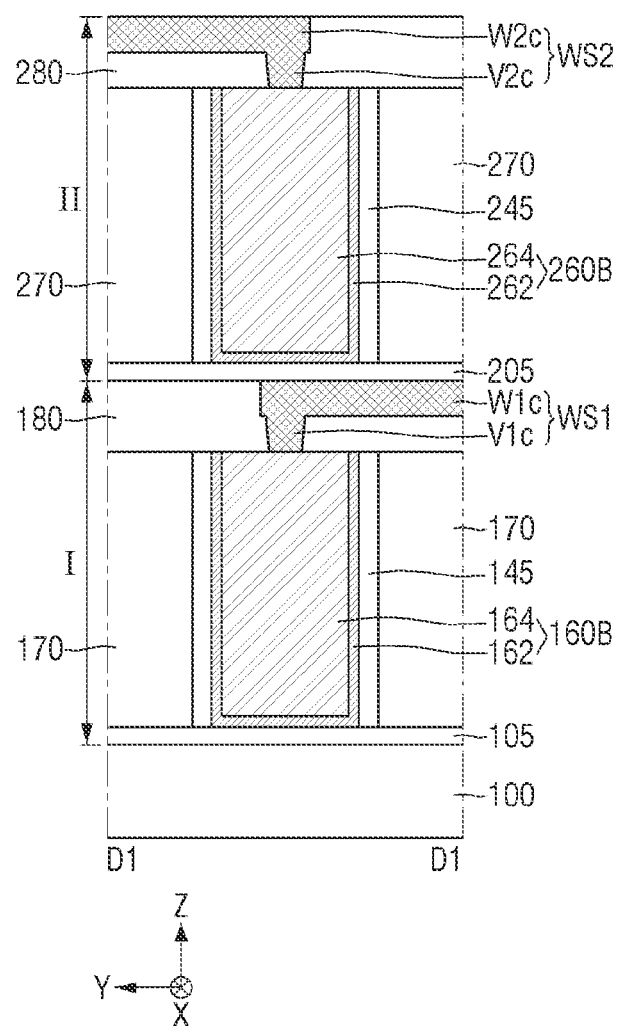
FIG. 6 is a cross-sectional view taken along D1-D1 of FIG. 2.

FIG. 1 shows an exemplary circuit for explaining a semiconductor device according to an embodiment. FIG. 2 shows an exemplary layout for explaining the semiconductor device of FIG. 1. FIG. 3 shows a cross-sectional view taken along A1-A1 of FIG. 2. FIG. 4 shows a cross-sectional view taken along line B1-B1 of FIG. 2. FIG. 5 shows a cross-sectional view taken along C1-C1 of FIG. 2. FIG. 6 shows a cross-sectional view taken along D1-D1 of FIG. 2.

Referring to FIG. 1, a semiconductor device according to an embodiment includes a first transistor TR1 and a second transistor TR2.

The first transistor TR1 and the second transistor TR2 may have different conductive types. As an example, the first transistor TR1 may be an NMOS Field Effect Transistor (NFET) and the second transistor TR2 may be a PMOS Field Effect Transistor (PFET). However, this is merely an example, and it goes without saying that the first transistor TR1 may be a PFET and the second transistor TR2 may be an NFET in an alternate embodiment.

The first transistor TR1 and the second transistor TR2 may be electrically connected. In an embodiment, the first transistor TR1 and the second transistor TR2 may form a first complementary metal oxide semiconductor (CMOS) circuit. For example, the first transistor TR1 and the second transistor TR2 may form a first inverter INV1 connected in parallel between a first power supply node $V_{DD}$ and a second power supply node $V_{SS}$. An input of the first inverter INV1 may be commonly connected to gates of the first transistor TR1 and the second transistor TR2, and an output of the first inverter INV1 may be commonly connected to a drain between the first transistor TR1 and the second transistor TR2.

Referring to FIGS. 2 to 6, the semiconductor device according to an embodiment includes a substrate 100, a first etch blocking film 105, a first transistor TR1, a first wiring structure WS1, a second etch blocking film 205, a second transistor TR2, and a second wiring structure WS2.

The substrate 100 may be bulk silicon or silicon-on-insulator (SOI). In contrast, the substrate 100 may be a silicon substrate, or may include other materials, for example, silicon germanium, silicon germanium on insulator (SGOI), indium antimonide, lead tellurium compounds, indium arsenide, indium phosphide, gallium arsenide or gallium antimonide. Alternatively, the substrate 100 may have an epitaxial layer formed on the base substrate. For convenience of explanation, the substrate 100 will be described below as a silicon substrate, without limitation thereto.

The first transistor TR1 and the second transistor TR2 may be sequentially stacked on the substrate 100. A region on the substrate 100 on which the first transistor TR1 is disposed may be referred to as a first region I, and a region on the substrate 100 on which the second transistor TR2 is disposed may be referred to as a second region II.

The first etch blocking film 105 may be formed on the substrate 100. The first transistor TR1 may be formed on the first etch blocking film 105. The first etch blocking film 105 may cover at least a part of the upper surface of the substrate 100. The first etch blocking film 105 may include, but is not limited to, an insulating material, for example, at least one of silicon nitride, silicon oxynitride, silicon oxycarbide, silicon boron nitride, silicon boron carbonitride, silicon oxycarbonitride, and combinations thereof. As an example, the first etch blocking film 105 may include a silicon nitride film.

In an embodiment, the first etch blocking film 105 may electrically separate the substrate 100 from the first transistor TR1. For example, the first etch blocking film 105 may completely cover the upper surface of the substrate 100, without limitation thereto.

The first transistor TR1 may include a first active pattern AP1, a first gate dielectric film 120, a first gate electrode 130, a first gate spacer 140, and first source/drain contacts 160A and 160B.

The first active pattern AP1 may be formed on the substrate 100 and the first etch blocking film 105. Further, the first active pattern AP1 may be spaced apart from the substrate 100 and the first etch blocking film 105. The first active pattern AP1 may extend in a first direction X parallel to the upper surface of the substrate 100.

In an embodiment, the first active pattern AP1 may include a plurality of sheet patterns 112 and 114 that are sequentially disposed on the substrate 100 (or the first etch blocking film 105) and are spaced apart from each other. For example, the first active pattern AP1 may include a first sheet pattern 112, and a second sheet pattern 114 that is farther than the first sheet pattern 112 from the substrate 100. Such sheet patterns 112 and 114 may be used as channel regions of MBCFET® including a multi-bridge channel.

The first active pattern AP1 may include a two-dimensional semiconductor material. The two-dimensional semiconductor material may include, but is not limited to, for example, graphene, carbon nanotube, transition metal dichalcogenide (TMD), or combinations thereof. The transition metal dichalcogenide (TMD) may include, for example, one metal element among Mo, W, Nb, V, Ta, Ti, Zr, Hf, Tc, Re, Cu, Ga, In, Sn, Ge and Pb, and one chalcogen element among S, Se and Te. The first active pattern AP1 may include a single layer or multiple layers of the above-mentioned two-dimensional semiconductor material. In an embodiment, the first active pattern AP1 may include the transition metal dichalcogenide (TMD).

The first gate electrode 130 may be formed on the substrate 100 and the first etch blocking film 105. The first gate electrode 130 may intersect the first active pattern AP1. For example, the first gate electrode 130 may extend in a second direction Y that is parallel to the upper surface of the substrate 100 and intersects the first direction X. The first active pattern AP1 may extend in the first direction X and penetrate the first gate electrode 130. Such a first gate electrode 130 may surround the periphery of the first active pattern AP1.

The first gate electrode 130 may include a conductive material, for example, but is not limited to, at least one of TiN, WN, TaN, Ru, TiC, TaC, Ti, Ag, Al, TiAl, TiAlN, TiAlC, TaCN, TaSiN, Mn, Zr, W and a combination thereof. The first gate electrode 130 may be formed through a replacement process, but is not limited thereto.

Although the first gate electrode 130 is shown as a single film, this is merely an example, and the first gate electrode 130 may, of course, be formed by stacking a plurality of conductive layers, without limitation thereto. For example, the first gate electrode 130 may include a work function film that adjusts a work function, and a filling conductive film that fills a space formed by the work function film. The work function film may include, for example, but is not limited to, at least one of TiN, TaN, TiC, TaC, TiAlC, and combinations thereof. The filling conductive film may include, for example, but is not limited to, W or Al.

The first gate dielectric film 120 may be interposed between the first active pattern AP1 and the first gate electrode 130. For example, the first gate dielectric film 120 may surround the periphery of the first active pattern AP1, and the first gate electrode 130 may be stacked on the first gate dielectric film 120. The first gate dielectric film 120 may be interposed between the first etch blocking film 105 and the first gate electrode 130.

The first gate dielectric film 120 may include a dielectric material, for example, at least one of silicon oxide, silicon oxynitride, silicon nitride or a high dielectric constant material having a higher dielectric constant than silicon oxide. The high dielectric constant material may include, for example, but is not limited to, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

The first gate spacer 140 may be formed on the substrate 100 and the first etch blocking film 105. Further, the first gate spacer 140 may be formed on the side surface of the first gate electrode 130. For example, the first gate spacer 140 may extend in the second direction Y along the side surface of the first gate electrode 130. The first active pattern AP1 may extend in the first direction X and penetrate the first gate spacer 140.

The first gate spacer 140 may include an insulating material, for example, but is not limited to, at least one of silicon nitride, silicon oxynitride, silicon oxycarbide, silicon boron nitride, silicon boron carbonitride, silicon oxycarbonitride, and combinations thereof.

In an embodiment, the first gate dielectric film 120 may include a first sub-dielectric film 122 and a second sub-dielectric film 124 that are sequentially stacked on the first active pattern AP1.

The first sub-dielectric film 122 may surround the periphery of the first active pattern AP1. For example, the first sub-dielectric film 122 may conformally extend along the periphery of the first active pattern AP1. A part of the first sub-dielectric film 122 may be interposed between the first active pattern AP1 and the first gate spacer 140.

The second sub-dielectric film 124 may surround the periphery of the first sub-dielectric film 122. Further, a part of the second sub-dielectric film 124 may be interposed between the first gate electrode 130 and the first gate spacer 140. For example, the second sub-dielectric film 124 may conformally extend along the profile of the periphery of the first sub-dielectric film 122 and the inner surface of the first gate spacer 140. The second sub-dielectric film 124 need not be interposed between the first sub-dielectric film 122 and the first gate spacer 140.

The first sub-dielectric film 122 and the second sub-dielectric film 124 may include the same dielectric material as each other, or may include different dielectric materials from each other. Although an example in which there is a boundary between the first sub-dielectric film 122 and the second sub-dielectric film 124 is shown, this is exemplary, without limitation thereto. Needless to say, in some embodiments, there may be no boundary between the first sub-dielectric film 122 and the second sub-dielectric film 124. In other embodiments, the first sub-dielectric film 122 may be omitted.

The first source/drain contacts 160A and 160B may be formed on the substrate 100 and the first etch blocking film 105. The first source/drain contacts 160A and 160B may be formed on at least one side surface of the first gate electrode 130. The first active pattern AP1 penetrates the first gate electrode 130 and the first gate spacer 140 and may be connected to the first source/drain contacts 160A and 160B. For example, the first source/drain contacts 160A and 160B may include a first contact 160A and a second contact 160B each formed on both side surfaces of the first gate electrode 130. One end of the first active pattern AP1 may be connected to the first contact 160A, and the other end of the first active pattern AP1 may be connected to the second contact 160B. The first source/drain contacts 160A and 160B may be electrically separated from the first gate electrode 130 by the first gate dielectric film 120 and/or the first gate spacer 140.

In an embodiment, the first source/drain contacts 160A and 160B may include a contact insertion film 162 and a first filling metal film 164 stacked sequentially on the upper surface of the substrate 100 (or the first etch blocking film 105) and the side surfaces of the first gate electrode 130.

A first contact insertion film 162 may extend along an outer surface of the first active pattern AP1, an outer surface of the first gate dielectric film 120, and an outer surface of the first gate spacer 140. Further, the first contact insertion film 162 may extend along the upper surface of the first etch blocking film 105.

The first contact insertion film 162 may be in direct contact with the first active pattern AP1 to form an ohmic contact. For example, when the first active pattern AP1 includes a two-dimensional semiconductor material used as a channel region of a NFET, the work function of the first contact insertion film 162 may be smaller than the work function of the two-dimensional semiconductor material. Alternatively, for example, when the first active pattern AP1 includes a two-dimensional semiconductor material used as a channel region of a PFET, the work function of the first contact insertion film 162 may be greater than the work function of the two-dimensional semiconductor material. Therefore, the contact resistance between the first active pattern AP1 and the first source/drain contacts 160A and 160B may be improved.

The first contact insertion film 162 that forms an ohmic contact with the first active pattern AP1 may include, for example, a semimetal material. The semimetal material may include, for example, but is not limited to, arsenic (As), antimony (Sb), bismuth (Bi), tin (Sn), indium (In), ruthenium (Ru) or an allotrope of carbon such as graphite.

The first filling metal film 164 may be stacked on the first contact insertion film 162. The first filling metal film 164 may fill the regions of the first source/drain contacts 160A and 160B that remain after the first contact insertion film 162 is formed. The first filling metal film 164 may include, for example, but is not limited to, metallic materials such as nickel (Ni), palladium (Pd), gold (Au), titanium (Ti), silver (Ag), aluminum (Al), tungsten (W), copper (Cu), manganese (Mn), and zirconium (Zr).

In an embodiment, a first source/drain spacer 145 may be formed on the substrate 100 and the first etch blocking film 105. As shown in FIGS. 5 and 6, the first source/drain spacer 145 may be formed on the side surfaces of the first source/drain contacts 160A and 160B. For example, the first source/drain spacer 145 may extend in the first direction X along the side surfaces of the first source/drain contacts 160A and 160B.

The first wiring structure WS1 may be formed on the first gate electrode 130 and the first source/drain contacts 160A and 160B. For example, a first interlayer insulating film 170 that covers the side surface of the first gate electrode 130 and the side surfaces of the first source/drain contacts 160A and 160B may be formed on the substrate 100 and the first etch blocking film 105. The first wiring structure WS1 may be stacked on the upper surface of the first interlayer insulating film 170.

The first wiring structure WS1 may be electrically connected to at least one of the first gate electrode 130 and the first source/drain contacts 160A and 160B. For example, the first wiring structure WS1 may include a first inter-wiring insulating film 180, and first wiring patterns W1a to W1c that each extend in the second direction Y inside the first inter-wiring insulating film 180. The first wiring patterns W1a to W1c may be electrically connected to the first gate electrode 130 and/or the first source/drain contacts 160A and 160B through the first via patterns V1a to V1c extending in the third direction Z inside the first inter-wiring insulating film 180. However, this is exemplary, and the first wiring structure WS1 may, of course, be electrically connected to the first gate electrode 130 and/or the first source/drain contacts 160A and 160B in various other forms, without limitation thereto.

As an example, the first wiring structure WS1 may include a first wiring W1a, a second wiring W1b, a third wiring W1c, a first via V1a, a second via V1b, and a third via V1c. The first wiring W1a may be connected to the first contact 160A through the first via V1a. The second wiring W1b may be connected to the first gate electrode 130 through the second via V1b. The third wiring W1c may be connected to the second contact 160B through the third via V1c.

A second etch blocking film 205 may be formed on the first wiring structure WS1. The second transistor TR2 may be formed on the second etch blocking film 205. The second etch blocking film 205 may cover at least a part of the upper surface of the first wiring structure WS1. The second etch blocking film 205 may include the same insulating material as the first etch blocking film 105, and may include an insulating material different from that of the first etch blocking film 105.

The second transistor TR2 may include a second active pattern AP2, a second gate dielectric film 220, a second gate electrode 230, a second gate spacer 240, and second source/drain contacts 260A and 260B.

The second active pattern AP2 may be formed on the second etch blocking film 205. Further, the second active pattern AP2 may be spaced apart from the second etch blocking film 205. In an embodiment, the second active pattern AP2 may extend in a first direction X parallel to the first active pattern AP1.

In an embodiment, the second active pattern AP2 may include a plurality of sheet patterns 212 and 214 sequentially disposed on the second etch blocking film 205 and separated from each other. For example, the second active pattern AP2 may include a third sheet pattern 212, and a fourth sheet pattern 214 that is farther than the third sheet pattern 212 from the second etch blocking film 205. Such sheet patterns 212 and 214 may be used as channel regions of MBCFET® including a multi-bridge channel.

The second active pattern AP2 may include a two-dimensional semiconductor material. In an embodiment, the first active pattern AP1 and the second active pattern AP2 may include two-dimensional semiconductor materials that are different from each other. For example, the first active pattern AP1 and the second active pattern AP2 may include different transition metal dichalcogenides (TMD) from each other. As an example, when the first transistor TR1 is an NFET and the second transistor TR2 is a PFET, the first active pattern AP1 may include $MoS_2$ or $MoSe_2$, the second active pattern AP2 may include $WS_2$ or $WSe_2$. In some other embodiments, the first active pattern AP1 and the second active pattern AP2 may include the same two-dimensional semiconductor material as each other.

The second gate electrode 230 may be formed on the second etch blocking film 205. The second gate electrode 230 may intersect the second active pattern AP2. For example, the second gate electrode 230 may extend in the second direction Y parallel to the first gate electrode 130. The second active pattern AP2 may extend in the first direction X and penetrate the second gate electrode 230. Such a second gate electrode 230 may surround the second active pattern AP2.

In an embodiment, the first gate electrode 130 and the second gate electrode 230 may include different conductive materials from each other. As an example, when the first transistor TR1 is an NFET and the second transistor TR2 is a PFET, the first gate electrode 130 may include an n-type work function film, and the second gate electrode 230 may include a p-type work function film. In some other embodiments, the first gate electrode 130 and the second gate electrode 230 may include the same conductive material as each other.

The second gate dielectric film 220 may be interposed between the second active pattern AP2 and the second gate electrode 230. For example, the second gate dielectric film 220 may surround the periphery of the second active pattern AP2, and the second gate electrode 230 may be stacked on the second gate dielectric film 220. The second gate dielectric film 220 may be interposed between the second etch blocking film 205 and the second gate electrode 230.

In an embodiment, the first gate dielectric film 120 and the second gate dielectric film 220 may include different dielectric materials from each other. In some other embodiments, the first gate dielectric film 120 and the second gate dielectric film 220 may include the same dielectric material as each other.

The second gate spacer 240 may be formed on the second etch blocking film 205. Further, the second gate spacer 240 may be formed on the side surface of the second gate electrode 230. For example, the second gate spacer 240 may extend in the second direction Y along the side surface of the second gate electrode 230. The second active pattern AP2 may extend in the first direction X and penetrate the second gate spacer 240. The second gate spacer 240 may include the same insulating material as the first gate spacer 140, and may include a different insulating material from the first gate spacer 140.

In an embodiment, the second gate dielectric film 220 may include a third sub-dielectric film 222 and a fourth sub-dielectric film 224 that are sequentially stacked on the second active pattern AP2. Since the third sub-dielectric film 222 and the fourth sub-dielectric film 224 may each be similar to the first sub-dielectric film 122 and the second sub-dielectric film 124, substantially duplicate description thereof may be omitted below.

The second source/drain contacts 260A and 260B may be formed on the second etch blocking film 205. The second source/drain contacts 260A and 260B may be formed on at least one side surface of the second gate electrode 230. The second active pattern AP2 penetrates the second gate electrode 230 and the second gate spacer 240, and may be connected to the second source/drain contacts 260A and 260B. For example, the second source/drain contacts 260A and 260B may include a third contact 260A and a fourth contacts 260B each formed on both side surfaces of the second gate electrode 230. One end of the second active pattern AP2 may be connected to the third contact 260A, and the other end of the second active pattern AP2 may be connected to the fourth contact 260B. The second source/drain contacts 260A and 260B may be electrically separated from the second gate electrode 230 by the second gate dielectric film 220 and/or the second gate spacer 240.

In an embodiment, the second source/drain contacts 260A and 260B may include a second contact insertion film 262 and a second filling metal film 264 that are sequentially stacked on the upper surface of the second etch blocking film 205 and the side surfaces of the second gate electrode 230. Since the second contact insertion film 262 and the second filling metal film 264 may each be similar to the first contact insertion film 162 and the first filling metal film 164, substantially duplicate description thereof may be omitted below.

In an embodiment, the first contact insertion film 162 and the second contact insertion film 262 may include different semimetal materials from each other. As an example, when the first transistor TR1 is an NFET and the second transistor TR2 is a PFET, the first contact insertion film 162 may include at least one of bismuth (Bi), antimony (Sb), tin (Sn) and indium (In), and the second contact insertion film 262 may include ruthenium (Ru).

In an embodiment, the first filling metal film 164 and the second filling metal film 264 may include different metal materials from each other. In some other embodiments, the first filling metal film 164 and the second filling metal film 264 may include the same metal material as each other.

In an embodiment, a second source/drain spacer 245 may be formed on the second etch blocking film 205. As shown in FIGS. 5 and 6, the second source/drain spacer 245 may be formed on the side surface of the second source/drain contacts 260A and 260B. For example, the second source/drain spacer 245 may extend in the first direction X along the side surfaces of the second source/drain contacts 260A and 260B.

The second wiring structure $WS_2$ may be formed on the second gate electrode 230 and the second source/drain contacts 260A and 260B. For example, a second interlayer insulating film 270 that covers the side surface of the second gate electrode 230 and the side surfaces of the second source/drain contact 260A and 260B may be formed on the second etch blocking film 205. The second wiring structure $WS_2$ may be stacked on the upper surface of the second interlayer insulating film 270.

The second wiring structure $WS_2$ may be electrically connected to at least one of the second gate electrode 230 and the second source/drain contacts 260A and 260B. For example, the second wiring structure $WS_2$ may include a second inter-wiring insulating film 280, and second wiring patterns W2a to W2c each extending in the second direction Y inside the second inter-wiring insulating film 280. The second wiring patterns W2a to W2c may be electrically connected to the second gate electrode 230 and/or the second source/drain contacts 260A and 260B through the second via patterns V2a to V2c extending in the third direction Z inside the second inter-wiring insulating film 280. However, this is exemplary, and the second wiring structure $WS_2$ may, of course, be electrically connected to the second gate electrode 230 and/or the second source/drain contacts 260A and 260B in various other forms, without limitation thereto.

As an example, the second wiring structure $WS_2$ may include a fourth wiring W2a, a fifth wiring W2b, a sixth wiring W2c, a fourth via V2a, a fifth via V2b, and a sixth via V2c. The fourth wiring W2a may be connected to the third contact 260A through the fourth via V2a. The fifth wiring W2b may be connected to the second gate electrode 230 through the fifth via V2b. The sixth wiring W2c may be connected to the fourth contact 260B through the sixth via V2c.

In an embodiment, the first contact 160A and the third contact 260A may be electrically connected. For example, as shown in FIGS. 3 and 5, the third contact 260A may penetrate the second etch blocking film 205 and be electrically connected to the first wiring structure WS1. As an example, the third contact 260A may be connected to the first contact 160A through the first via V1a and the first wiring W1a. Such a first contact 160A and a third contact 260A may be provided as an output of the first inverter INV1 of FIG. 1.

In an embodiment, the first gate electrode 130 and the second gate electrode 230 may be electrically connected. For example, as shown in FIG. 4, a first through via V2d that extends in the third direction Z to electrically connect the first wiring structure WS1 and the second wiring structure $WS_2$ may be formed. As an example, the first through via V2d may penetrate the second etch blocking film 205 and the second interlayer insulating film 270 to connect the second wiring W1b and the fifth wiring W2b. Such a first gate electrode 130 and a second gate electrode 230 may be provided as an input of the first inverter INV1 of FIG. 1.

In an embodiment, the second contact 160B and the fourth contact 260B may be electrically separated. For example, as shown in FIGS. 3 and 6, the fourth contact 260B may be separated from the first wiring structure WS1 by the second etch blocking film 205. Different power supply voltages may be applied to the second contact 160B and the fourth contact 260B. As an example, when the first transistor TR1 is an NFET and the second transistor TR2 is a PFET, the second contact 160B may be connected to the first power supply node $V_{SS}$ of FIG. 1 through the third via V1c and the third wiring W1c. The fourth contact 260B may be connected to the first power supply node $V_{DD}$ of FIG. 1 through the sixth via V2c and the sixth wiring W2c.

As a method for improving the degree of integration of a semiconductor device, a three-dimensional (3D) stacked semiconductor device in the form of being stacked vertically has been studied. For example, as a method for realizing the three-dimensional stacked semiconductor device, it is possible to use a sequential integration in which a lower stack is formed first and then an upper stack is formed. However, in the case of a semiconductor device that requires a high-temperature process, the performance of the lower stack may deteriorate due to the high-temperature process for forming the upper stack. For example, in a semiconductor device that requires a source/drain epitaxial (S/D epitaxial) process, since a high-temperature process of about 1100° C. might be used, there may be difficulty in implementation of a three-dimensional stacked semiconductor through the above-mentioned sequential integration.

In contrast, since the semiconductor device according to an embodiment uses a two-dimensional semiconductor material as a channel, the three-dimensional stacked semiconductor device may be implemented at a relatively low temperature (for example, about 100° C. to about 600° C.). As described above, the first transistor TR1 and the second transistor TR2 stacked in the vertical direction (for example, a third direction Z) may use the first active pattern AP1 and the second active pattern AP2 each including the two-dimensional semiconductor material as the channel region. This makes it possible to provide a semiconductor device having improved performance and degree of integration.

Further, the semiconductor device according to an embodiment may efficiently connect the first transistor TR1 and the second transistor TR2 stacked in the vertical direction (for example, the third direction Z) using the first wiring structure WS1 and the second wiring structure WS$_2$. As described above, the first wiring structure WS1 and the second wiring structure WS$_2$ may be arranged along the vertical direction (for example, the third direction Z) together with the first transistor TR1 and the second transistor TR2. Further, the first wiring structure WS1 and the second wiring structure WS$_2$ may be selectively connected by the second etch blocking film 205 and/or the first through via V2d. Accordingly, wiring for connecting the first transistor TR1 and the second transistor TR2 is saved, and a semiconductor device with further improved performance and degree of integration can be provided.

Figure 7:
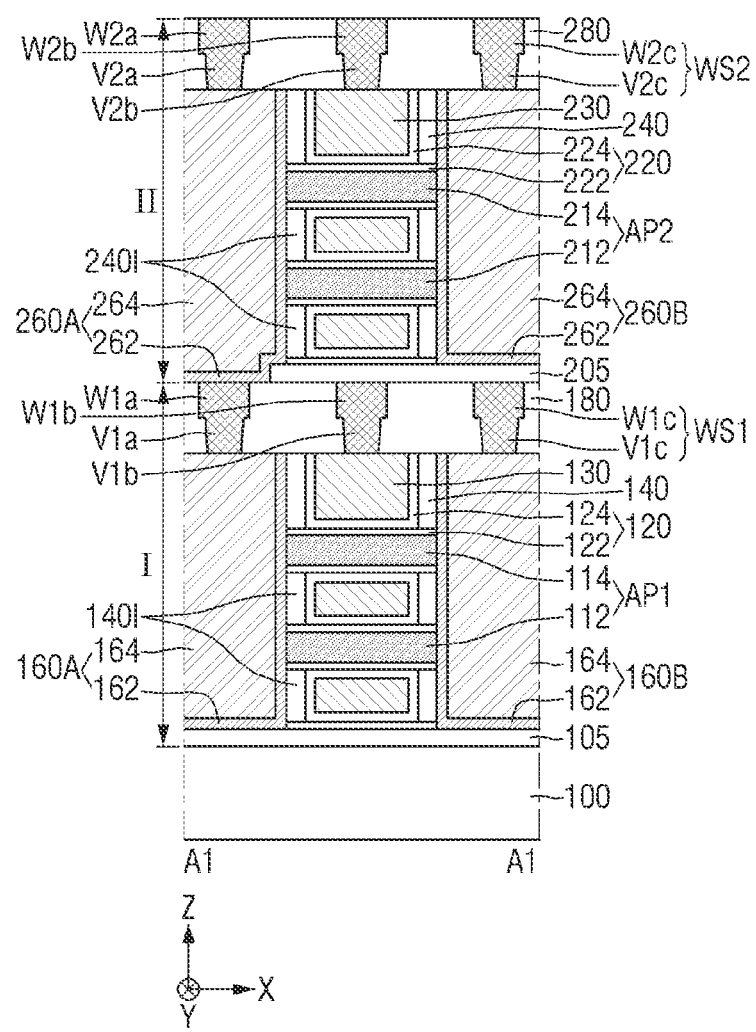
FIG. 7 is an exemplary cross-sectional diagram for explaining a semiconductor device according to an embodiment.

FIG. 7 shows an exemplary cross-sectional view for explaining a semiconductor device according to an embodiment. For convenience of explanation, repeated parts of contents explained above using FIGS. 1 to 6 may be briefly described or omitted. For reference, FIG. 7 shows a cross-sectional view taken along A1 to A1 of FIG. 2.

Referring to FIGS. 2 and 7, a semiconductor device according to an embodiment further includes a first internal spacer 1401 and/or a second internal spacer 2401.

The first internal spacer 1401 may be formed on the side surface of the first gate electrode 130 between the sheet patterns 112 and 114. Further, the first internal spacer 1401 may be formed on the side surface of the first gate electrode 130 between the first etch blocking film 105 and the sheet patterns 112 and 114. The first source/drain contacts 160A and 160B may be electrically separated from the first gate electrode 130 by the first gate spacer 140 and/or the first internal spacer 1401.

The second internal spacer 1401 may be formed on the side surface of the second gate electrode 230 between the sheet patterns 212 and 214. Further, the second internal spacer 2401 may be formed on the side surface of the second gate electrode 230 between the second etch blocking film 205 and the sheet patterns 212 and 214. The second source/drain contacts 260A and 260B may be electrically separated from the second gate electrode 230 by the second gate spacer 240 and/or the second internal spacer 2401.

The first internal spacer 1401 and the second internal spacer 2401 may each include an insulating material, for example, but is not limited to, at least one of silicon nitride, silicon oxynitride, silicon oxycarbide, silicon boron nitride, silicon boron carbonitride, silicon oxycarbonitride, and combinations thereof.

The first internal spacer 1401 and the second internal spacer 2401 may each include the same insulating material as the first gate spacer 140 and the second gate spacer 240, and have an insulating material different from the first gate spacer 140 and the second gate spacer 240. In an example, dielectric constants of the first internal spacer 1401 and the second internal spacer 2401 may differ from dielectric constants of the first gate spacer 140 and the second gate spacer 240.

Although FIG. 7 shows an example in which both the first internal spacer 1401 and the second internal spacer 2401 are formed, this is an example without limitation thereto. As an example, it goes without saying that one of the first internal spacer 1401 or the second internal spacer 2401 may be omitted.

Figure 8:
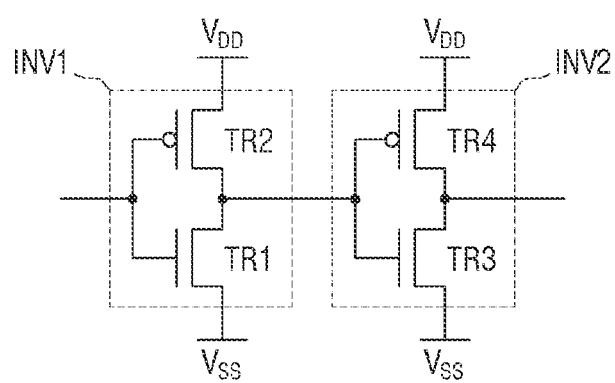
FIG. 8 is an exemplary circuit diagram for explaining a semiconductor device according to an embodiment.
Figure 9:
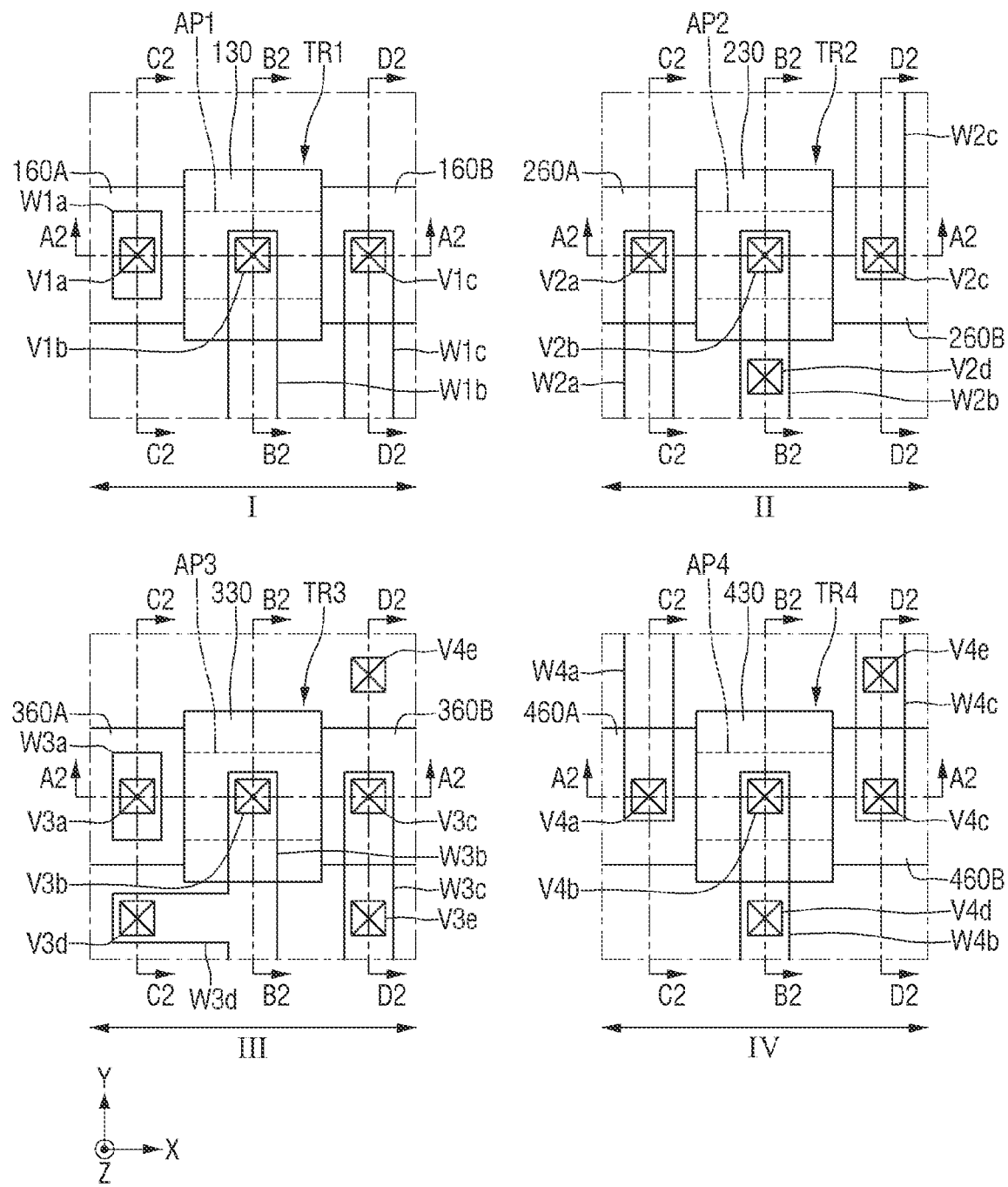
FIG. 9 is an exemplary layout diagram for explaining the semiconductor device of FIG. 8.
Figure 10:
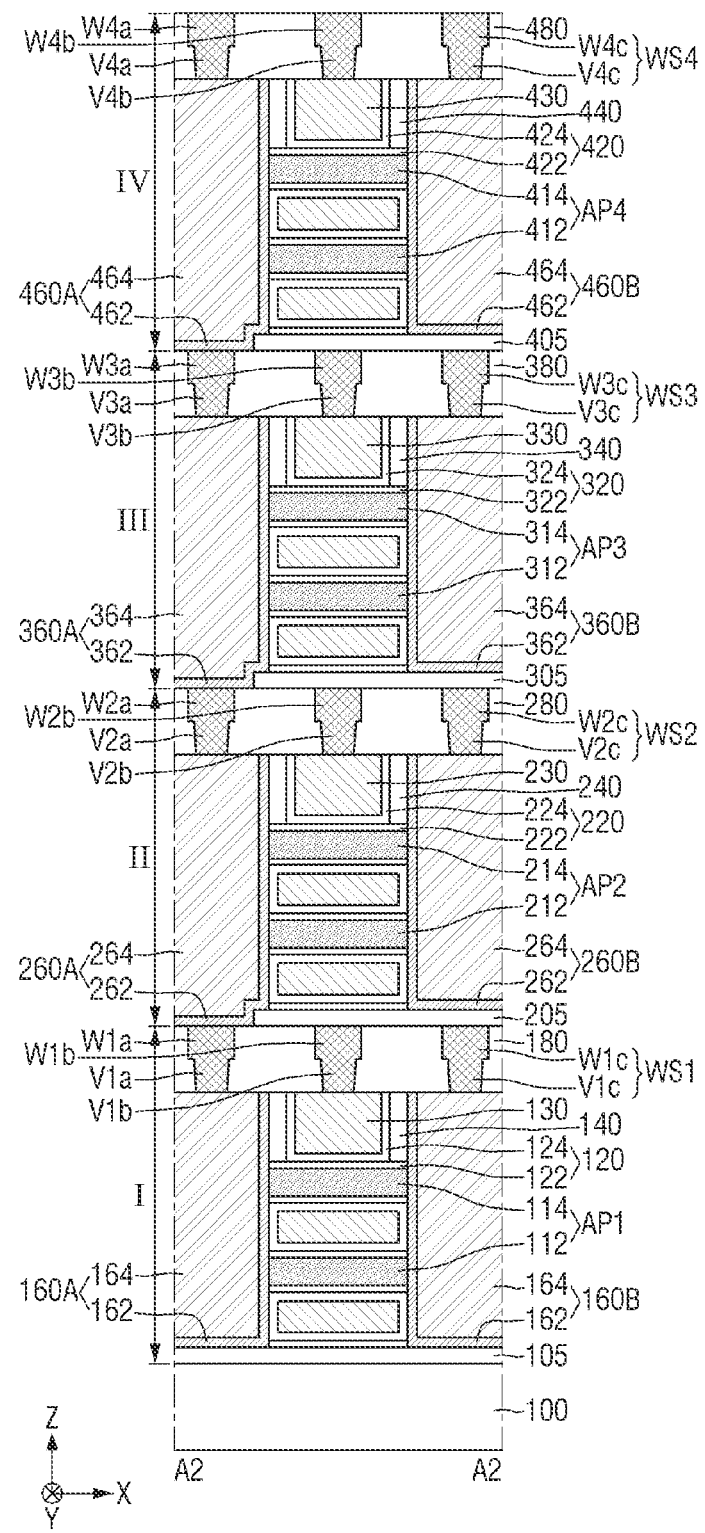
FIG. 10 is a cross-sectional view taken along A2-A2 of FIG. 9.
Figure 11:
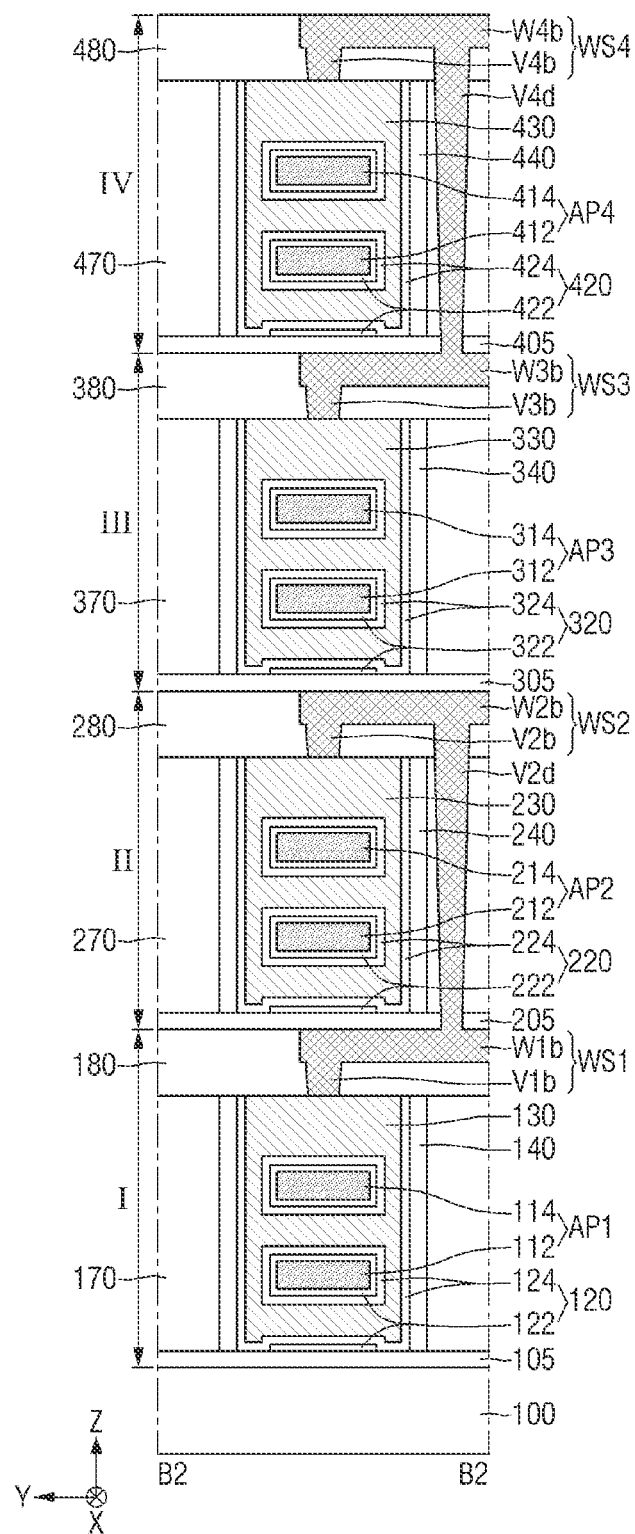
FIG. 11 is a cross-sectional view taken along B2-B2 of FIG. 9.
Figure 12:
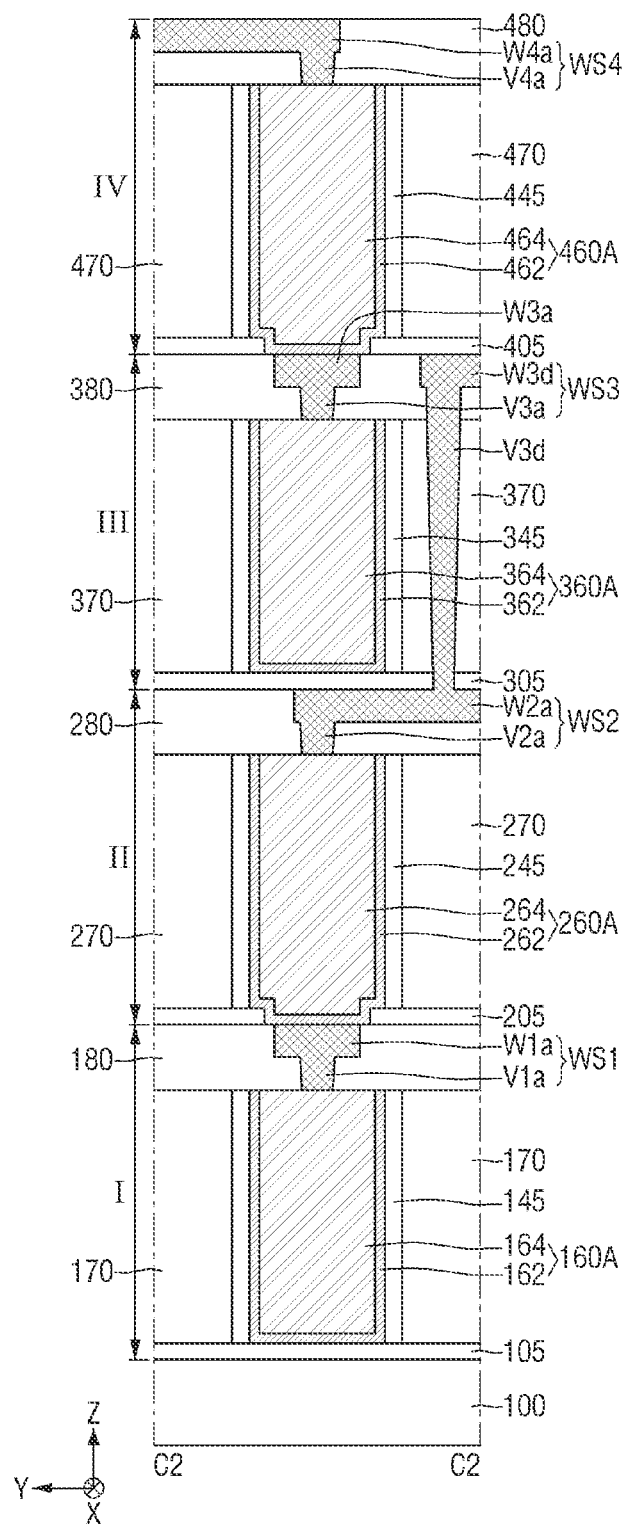
FIG. 12 is a cross-sectional view taken along C2-C2 of FIG. 9.
Figure 13:
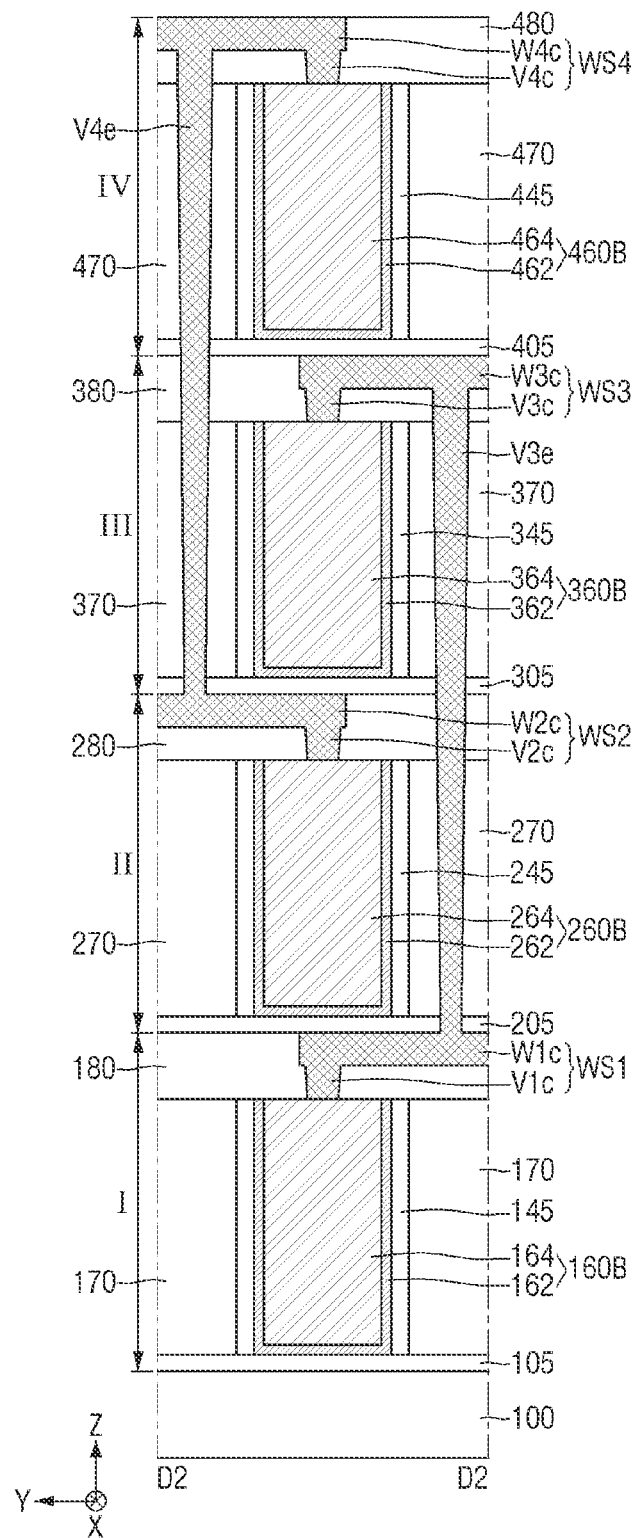
FIG. 13 is a cross-sectional view taken along D2-D2 of FIG. 9.

FIG. 8 shows an exemplary circuit diagram for explaining a semiconductor device according to an embodiment. FIG. 9 shows an exemplary layout diagram for explaining the semiconductor device of FIG. 8. FIG. 10 shows a cross-sectional view taken along A2-A2 of FIG. 9. FIG. 11 shows a cross-sectional view taken along B2-B2 of FIG. 9. FIG. 12 shows a cross-sectional view taken along C2-C2 of FIG. 9. FIG. 13 shows a cross-sectional view taken along D2-D2 of FIG. 9. For convenience of explanation, repeated parts of contents explained above using FIGS. 1 to 7 may be briefly described or omitted.

Referring to FIG. 8, a semiconductor device according to an embodiment includes a first transistor TR1, a second transistor TR2, a third transistor TR3, and a fourth transistor TR4.

The third transistor TR3 and the fourth transistor TR4 may have different conductive types from each other. As an example, the third transistor TR3 may be an NFET and the fourth transistor TR4 may be a PFET.

The third transistor TR3 and the fourth transistor TR4 may be electrically connected. In an embodiment, the third transistor TR3 and the fourth transistor TR4 may form a second CMOS circuit. For example, the third transistor TR3 and the fourth transistor TR4 may form a second inverter INV2 connected in parallel between the first power supply node $V_{DD}$ and the second power supply node $V_{SS}$. An input of the second inverter INV2 may be commonly connected to gates of the third transistor TR3 and the fourth transistor TR4, and an output of the second inverter INV2 may be commonly connected to a drain between the third transistor TR3 and the fourth transistor TR4.

In an embodiment, the first inverter INV1 and the second inverter INV2 may be connected. For example, the output of the first inverter INV1 may be provided as the input of the second inverter INV2.

Referring to FIGS. 9 to 13, the semiconductor device according to an embodiment includes a substrate 100, a first etch blocking film 105, a first transistor TR1, a first wiring structure WS1, a second etch blocking film 205, a second transistor TR2, a second wiring structure WS$_2$, a third etch blocking film 305, a third transistor TR3, a third wiring structure WS3, a fourth etch blocking film 405, a fourth transistor TR4, and a fourth wiring structure WS4.

The third transistor TR3 and the fourth transistor TR4 may be sequentially stacked on the second wiring structure WS$_2$. A region on the substrate 100 on which the third transistor TR3 is disposed may be referred to as a third region III, and a region on the substrate 100 on which the fourth transistor TR4 is disposed may be referred to as a fourth region IV.

The third etch blocking film 305 may be formed on the second wiring structure WS$_2$. The third transistor TR3 may be formed on the third etch blocking film 305. The third etch blocking film 305 may cover at least a part of the upper surface of the second wiring structure WS$_2$. The third etch blocking film 305 may include the same insulating material as the first etch blocking film 105, and may include an insulating material different from that of the first etch blocking film 105.

The third transistor TR3 may include a third active pattern AP3, a third gate dielectric film 320, a third gate electrode 330, a third gate spacer 340, and third source/drain contacts 360A and 360B. Since the third transistor TR3 may be similar to the first transistor TR1 except for formation on the second wiring structure WS$_2$, substantially duplicate description thereof may be omitted below.

The third wiring structure WS3 may be formed on the third gate electrode 330 and the third source/drain contacts 360A and 360B. For example, a third interlayer insulating film 370 that covers the side surface of the third gate electrode 330 and the side surfaces of the third source/drain contact 360A and 360B may be formed on the third etch blocking film 305. The third wiring structure WS3 may be stacked on the upper surface of the third interlayer insulating film 370.

The third wiring structure WS3 may be electrically connected to at least one of the third gate electrode 330 and the third source/drain contacts 360A and 360B. For example, the third wiring structure WS3 may include a third inter-wiring insulating film 380, and third wiring patterns W3a to W3c each extending in the second direction Y inside the third inter-wiring insulating film 380. The third wiring patterns W3a to W3c may be electrically connected to the third gate electrode 330 and/or the third source/drain contacts 360A and 360B through the third via pattern V3a to V3c extending in the third direction Z inside the third inter-wiring insulating film 380. However, this is exemplary without limitation thereto, and the third wiring structure WS3 may, of course, be electrically connected to the third gate electrode 330 and/or the third source/drain contacts 360A and 360B in various other forms.

As an example, the third wiring structure WS3 may include a seventh wiring W3a, an eighth wiring W3b, a ninth wiring W3c, a seventh via V3a, an eighth via V3b, and a ninth via V3c. The seventh wiring W3a may be connected to the fifth contact 360A through the seventh via V3a. The eighth wiring W3b may be connected to the third gate electrode 330 through the eighth via V3b. The ninth wiring W3c may be connected to the sixth contact 360B through the ninth via V3c.

The fourth transistor TR4 may include a fourth active pattern AP4, a fourth gate dielectric film 420, a fourth gate electrode 430, a fourth gate spacer 440, and fourth source/drain contacts 460A and 460B. Since the fourth transistor TR4 may be similar to the second transistor TR2 except for formation on the third wiring structure WS3, substantially duplicate description thereof may be omitted below.

The fourth wiring structure WS4 may be formed on the fourth gate electrode 430 and the fourth source/drain contacts 460A and 460B. For example, a fourth interlayer insulating film 470 that covers the side surface of the fourth gate electrode 430 and the side surfaces of the fourth source/drain contact 460A and 460B may be formed on the fourth etch blocking film 405. The fourth wiring structure WS4 may be stacked on the upper surface of the fourth interlayer insulating film 470.

The fourth wiring structure WS4 may be electrically connected to at least one of the fourth gate electrode 430 and the fourth source/drain contacts 460A and 460B. For example, the fourth wiring structure WS4 may include a fourth inter-wiring insulating film 480, and fourth wiring patterns W4a to W4c each extending in the second direction Y inside the fourth inter-wiring insulating film 480. The fourth wiring patterns W4a to W4c may be electrically connected to the fourth gate electrode 430 or the fourth source/drain contacts 460A and 460B through the fourth via patterns V4a to V4c extending in the fourth direction Z inside the fourth inter-wiring insulating film 480. However, this is exemplary without limitation thereto, and the fourth wiring structure WS4 may, of course, be electrically connected to the fourth gate electrode 430 and/or the fourth source/drain contacts 460A and 460B in various other forms.

As an example, the fourth wiring structure WS4 may include a tenth wiring W4a, an eleventh wiring W4b, a twelfth wiring W4c, a tenth via V4a, an eleventh via V4b, and a twelfth via V4c. The tenth wiring W4a may be connected to the seventh contact 460A through the tenth via V4a. The eleventh wiring W4b may be connected to the fourth gate electrode 430 through the eleventh via V4b. The twelfth wiring W4c may be connected to the eighth contact 460B through the twelfth via V4c.

In an embodiment, the fifth contact 360A and the seventh contact 460A may be electrically connected. For example, as shown in FIGS. 10 and 12, the seventh contact 460A may penetrate the fourth etch blocking film 405 and be electrically connected to the third wiring structure WS3. As an example, the seventh contact 460A may be connected to the fifth contact 360A through the seventh via V3a and the seventh wiring W3a. Such a fifth contact 360A and a seventh contact 460A may be provided as the output of the second inverter INV2 of FIG. 8.

In an embodiment, the third gate electrode 330 and the fourth gate electrode 430 may be electrically connected. For example, as shown in FIG. 11, a second through via V4d that extends in the third direction Z and electrically connects the third wiring structure WS3 and the fourth wiring structure WS4 may be formed. As an example, the second through via V4*d* may penetrate the fourth etch blocking film 405 and the fourth interlayer insulating film 470 to connect the eighth wiring W3*b* and the eleventh wiring W4*b*. Such a first gate electrode 130 and a second gate electrode 230 may be provided as an input of the second inverter INV2 of FIG. 8.

In an embodiment, the sixth contact 360B and the eighth contact 460B may be electrically separated. For example, as shown in FIGS. 10 and 13, the eighth contact 460B may be separated from the third wiring structure WS3 by the fourth etch blocking film 405. Different power supply voltages may be applied to the sixth contact 360B and the eighth contact 460B. As an example, when the third transistor TR3 is an NFET and the fourth transistor TR4 is a PFET, the sixth contact 360B may be connected to the second power supply node $V_{SS}$ of FIG. 8 through the ninth via V3*c* and the ninth wiring W3*c*. The eighth contact 460B may be connected to the first power supply node $V_{DD}$ of FIG. 8 through the twelfth via V4*c* and the twelfth wiring W4*c*.

In an embodiment, the second contact 160B and the sixth contact 360B may be electrically connected. For example, as shown in FIG. 13, a third through via V3*e* that extends in the third direction Z to electrically connect the first wiring structure WS1 and the third wiring structure WS3 may be formed. As an example, the third through via V3*e* may penetrate the second etch blocking film 205, the second interlayer insulating film 270, the second inter-wiring insulating film 280, the third etch blocking film 305, and the third interlayer insulating film 370 to connect the third wiring W1*c* and the ninth wiring W3*c*. Such a second contact 160B and a sixth contact 360B may be commonly connected to the second power supply node $V_{SS}$ of FIG. 8.

In an embodiment, the fourth contact 260B and the eighth contact 460B may be electrically connected. For example, as shown in FIG. 13, a fourth through via V4*e* that extends in the third direction Z to electrically connect the second wiring structure $WS_2$ and the fourth wiring structure WS4 may be formed. As an example, the fourth through via V4*e* may penetrate the third etch blocking film 305, the third interlayer insulating film 370, the fourth inter-wiring insulating film 480, the fourth etch blocking film 405, and the fourth interlayer insulating film 470 to connect the sixth wiring W2*c* and the twelfth wiring W4*c*. Such a fourth contact 260B and an eighth contact 460B may be commonly connected to the first power supply node $V_{DD}$ of FIG. 8.

In an embodiment, the first contact 160A and the third contact 260A may be electrically connected to the third gate electrode 330 and the fourth gate electrode 430. For example, as shown in FIGS. 9 and 12, a fifth through via V3*d* that extends in the third direction Z to electrically connect the second wiring structure $WS_2$ and the third wiring structure WS3 may be formed. Further, the third wiring structure WS3 may include a first connection wiring W3*d* that extends in the first direction X to connect the fifth through via V3*d* and the eighth wiring W3*b*. As an example, the fifth through via V3*d* may penetrate the third etch blocking film 305 and the third interlayer insulating film 370 to connect the fourth wiring W2*a* and the first connection wiring W3*d*. Therefore, the output of the first inverter INV1 of FIG. 8 may be provided as an input of the second inverter INV2 of FIG. 9.

Figure 14:
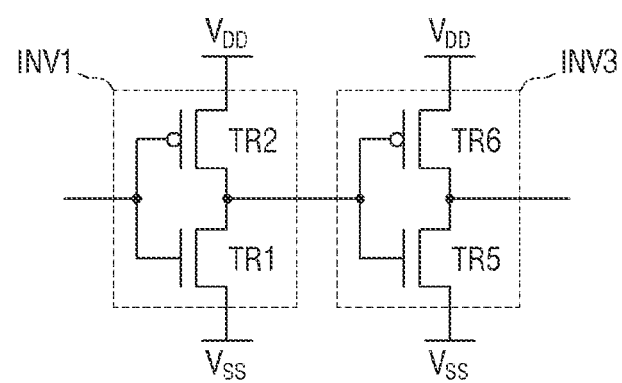
FIG. 14 is an exemplary circuit diagram for explaining a semiconductor device according to an embodiment.
Figure 15:
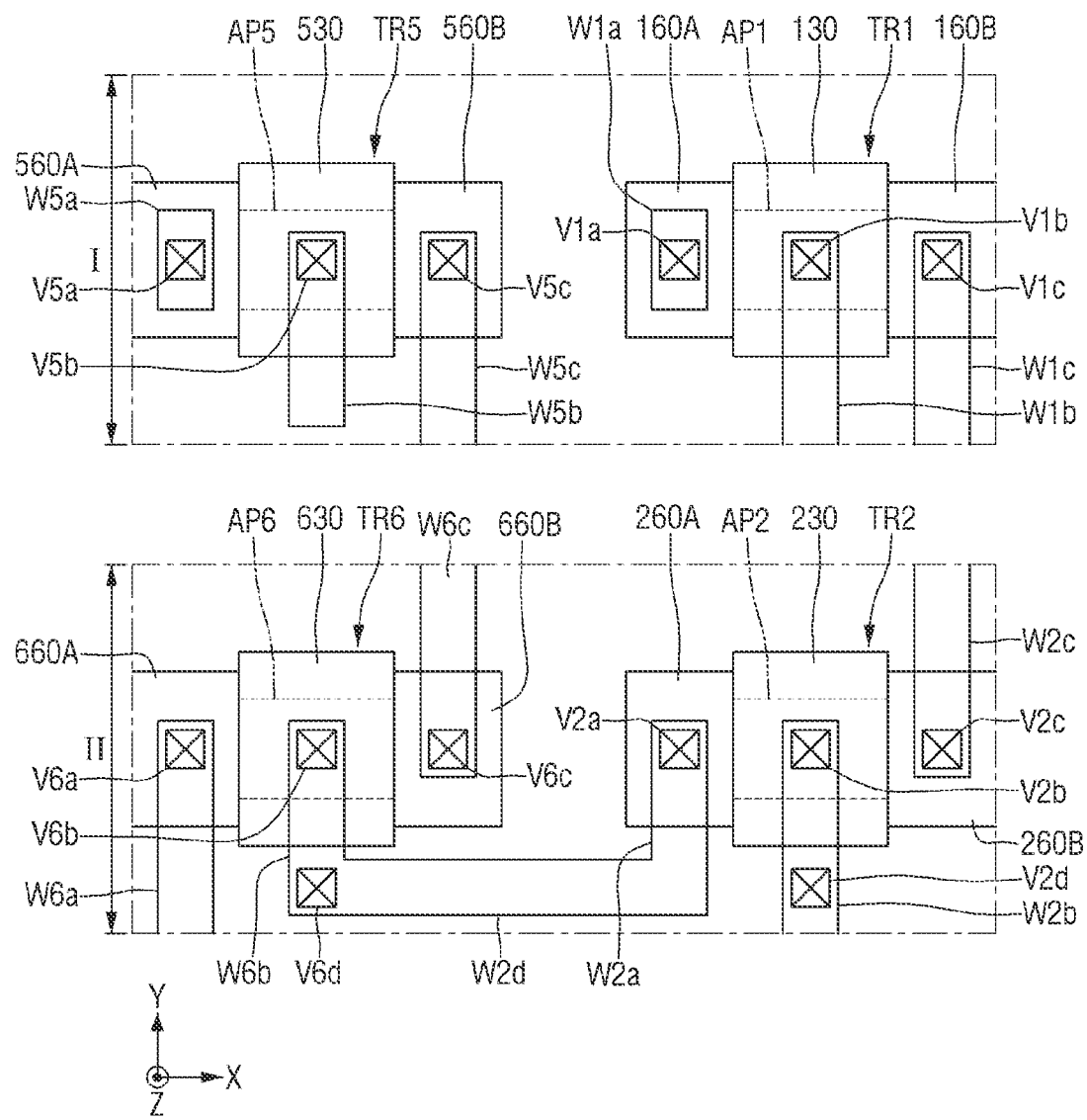
FIG. 15 is an exemplary layout diagram for explaining the semiconductor device of FIG. 14.

FIG. 14 is an exemplary circuit diagram for explaining a semiconductor device according to an embodiment. FIG. 15 is an exemplary layout diagram for explaining the semiconductor device of FIG. 14. For convenience of explanation, repeated parts of contents explained above using FIGS. 1 to 6 may be briefly described or omitted.

Referring to FIG. 14, a semiconductor device according to an embodiment includes a first transistor TR1, a second transistor TR2, a fifth transistor TR5, and a sixth transistor TR6.

The fifth transistor TR5 and the sixth transistor TR6 may have different conductive types from each other. As an example, the fifth transistor TR5 may be an NFET and the sixth transistor TR6 may be a PFET.

The fifth transistor TR5 and the sixth transistor TR6 may be electrically connected. In an embodiment, the fifth transistor TR5 and the sixth transistor TR6 may form a third CMOS circuit. For example, the fifth transistor TR5 and the sixth transistor TR6 may form a third inverter INV3 connected in parallel between the first power supply node $V_{DD}$ and the second power supply node $V_{SS}$. An input of the third inverter INV3 may be commonly connected to the gates of the fifth transistor TR5 and the sixth transistor TR6, and an output of the third inverter INV3 may be commonly connected to a drain between the fifth transistor TR5 and the sixth transistor TR6.

In an embodiment, the first inverter INV1 and the third inverter INV3 may be connected. For example, the output of the first inverter INV1 may be provided as the input of the third inverter INV3.

Referring to FIGS. 14 and 15, in a semiconductor device according to an embodiment, the fifth transistor TR5 is disposed in the first region I, and the sixth transistor TR6 is disposed in the second region II.

For example, the fifth transistor TR5 may be arranged along the first direction X together with the first transistor TR1, and the sixth transistor TR6 may be arranged along the first direction X together with the second transistor TR2. The fifth transistor TR5 and the sixth transistor TR6 may be sequentially stacked on the substrate 100.

The fifth transistor TR5 may include a fifth active pattern AP5, a fifth gate electrode 530, and fifth source/drain contacts 560A and 560B. Since the fifth transistor TR5 may be similar to the first transistor TR1, substantially duplicate description thereof may be omitted below.

The fifth gate electrodes 530 and/or the fifth source/drain contacts 560A and 560B may be electrically connected to the fifth wiring patterns W5*a* to W5*c* and the fifth via patterns V5*a* to V5*c*.

The sixth transistor TR6 may include a sixth active pattern AP6, a sixth gate electrode 630, and sixth source/drain contacts 660A and 660B. Since the sixth transistor TR6 may be similar to the second transistor TR2, substantially duplicate description thereof may be omitted below.

The sixth gate electrodes 630 and/or the sixth source/drain contacts 660A and 660B may be electrically connected to sixth wiring patterns W6*a* to W6*c* and sixth via patterns V6*a* to V6*c*.

The fifth transistor TR5 and the sixth transistor TR6 may be provided as the third inverter INV3 of FIG. 14 through the fifth wiring pattern W5*a* to W5*c*, the fifth via patterns V5*a* to V5*c*, the sixth wiring patterns W6*a* to W6*c*, the sixth via patterns V6*a* to V6*c*, and the sixth through via V6*d*. Since this may be similar to the configuration in which the first transistor TR1 and the second transistor TR2 are provided as the first inverter INV1, substantially duplicate description thereof may be omitted below.

In an embodiment, the first contact 160A and the third contact 260A may be electrically connected to the fifth gate electrode 530 and the sixth gate electrode 630. As an example, as shown, a second connection wiring W2*d* that extends in the first direction X to connect the fourth wiring W2a and a thirteenth wiring W6b may be formed. Therefore, the output of the first inverter INV1 of FIG. 14 may be provided as the input of the third inverter INV3 of FIG. 14.

Although an example in which the first inverter INV1 and the second inverter INV2 are connected in the second region II have been described, this is an example without limitation thereto. As an example, it goes without saying that the first inverter INV1 and the second inverter INV2 may be connected in the first region I.

Figure 16:
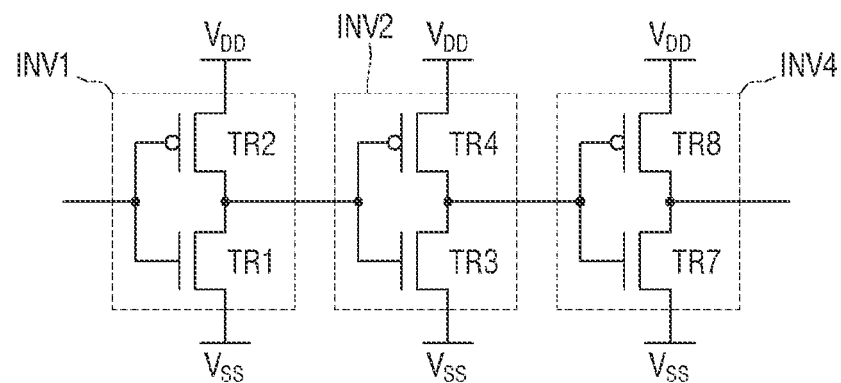
FIG. 16 is an exemplary circuit diagram for explaining a semiconductor device according to an embodiment.
Figure 17:
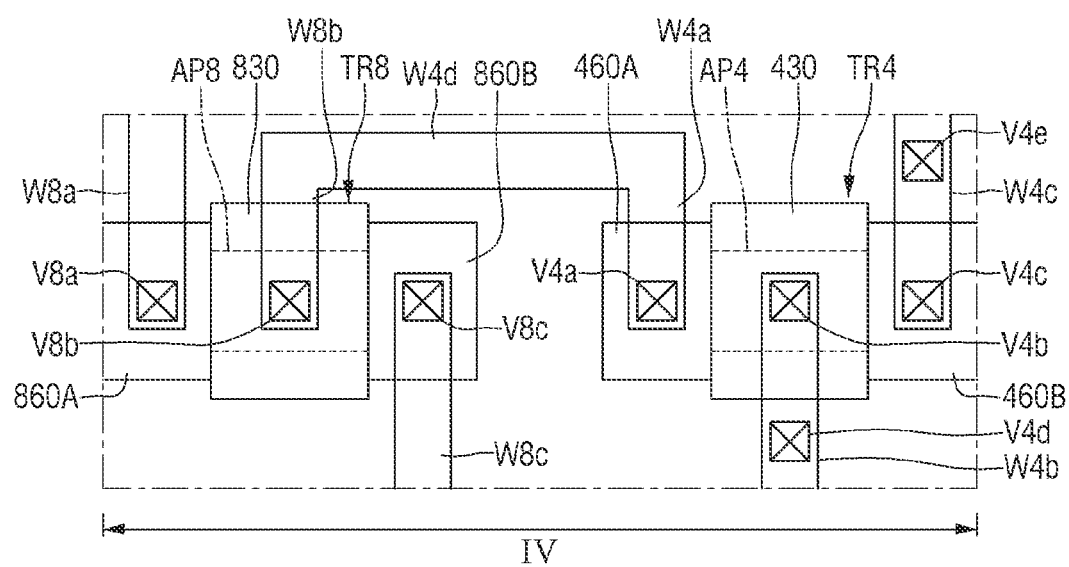
FIG. 17 is an exemplary layout diagram for explaining the semiconductor device of FIG. 16.

FIG. 16 is an exemplary circuit diagram for explaining a semiconductor device according to an embodiment. FIG. 17 is an exemplary layout diagram for explaining the semiconductor device of FIG. 16. For convenience of explanation, repeated parts of contents explained above using FIGS. 1 to 13 may be briefly described or omitted.

Referring to FIG. 16, a semiconductor device according to an embodiment include a first transistor TR1, a second transistor TR2, a third transistor TR3, a fourth transistor TR4, a seventh transistor TR7, and an eight transistor TR8.

The seventh transistor TR7 and the eighth transistor TR8 may have different conductive types from each other. As an example, the seventh transistor TR7 may be an NFET, and the eighth transistor TR8 may be a PFET.

The seventh transistor TR7 and the eighth transistor TR8 may be electrically connected. In an embodiment, the seventh transistor TR7 and the eighth transistor TR8 may form a fourth CMOS circuit. For example, the seventh transistor TR7 and the eighth transistor TR8 may form a fourth inverter INV4 connected in parallel between the first power supply node $V_{DD}$ and the second power supply node $V_{SS}$. An input of the fourth inverter INV4 may be commonly connected to gates of the seventh transistor TR7 and the eighth transistor TR8, and an output of the fourth inverter INV4 may be commonly connected to a drain between the seventh transistor TR7 and the eighth transistor TR8.

In an embodiment, the second inverter INV2 and the third inverter INV3 may be connected. For example, the output of the second inverter INV2 may be provided as the input of the third inverter INV3.

Referring to FIGS. 16 and 17, in the semiconductor device according to an embodiment, the eighth transistor TR8 is disposed in the fourth region IV.

For example, the eighth transistor TR8 may be disposed along the first direction X together with the fourth transistor TR4.

The eighth transistor TR8 may include an eighth active pattern AP8, an eighth gate electrode 830, and eighth source/drain contacts 860A and 860B. Since the eighth transistor TR8 may be similar to the second transistor TR2, substantially duplicate description thereof may be omitted below.

The eighth gate electrode 830 and/or the eighth source/drain contacts 860A and 860B may be electrically connected to eighth wiring patterns W8a to W8c and eighth via patterns V8a to V8c.

The seventh transistor TR7 and the eighth transistor TR8 may be provided as the fourth inverter INV4 of FIG. 16. Since this may be the same as the configuration in which the first transistor TR1 and the second transistor TR2 are provided as the first inverter INV1, substantially duplicate description thereof may be omitted below.

In an embodiment, the seventh contact 460A may be electrically connected to the eighth gate electrode 830. As an example, as shown, a third connection wiring W4d which extends in the first direction X to connect a tenth wiring W4a and a fourteenth wiring W8b may be formed. Therefore, the output of the second inverter INV2 of FIG. 16 may be provided as the input of the fourth inverter INV4 of FIG. 16.

Although the configuration in which the second inverter INV2 and the fourth inverter INV4 are connected in the fourth region IV is described, this is merely an example. As an example, it goes without saying that the second inverter INV2 and the fourth inverter INV4 may be connected in the first to third regions I to III.

Hereinafter, a method for fabricating a semiconductor device according to an exemplary embodiment may be described referring to FIGS. 18 to 29.

FIGS. 18 to 27 are intermediate step diagrams for explaining the method for fabricating a semiconductor device according to an embodiment. For convenience of explanation, repeated parts of contents explained above using FIGS. 1 to 17 may be briefly described or omitted.

Figure 18:
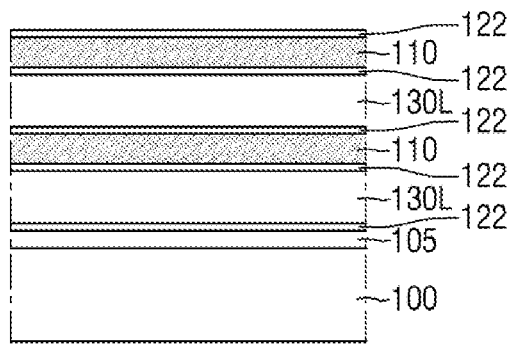
FIGS. 18 to 27 are intermediate step diagrams for explaining a method for fabricating a semiconductor device according to an embodiment.

Referring to FIG. 18, the first etch blocking film 105, the first sub-dielectric film 122, a first sacrificial film 130L, and the active film 110 are formed on the substrate 100.

The first etch blocking film 105 may be formed on the substrate 100. The first etch blocking film 105 may cover at least a part of the upper surface of the substrate 100.

The first sacrificial film 130L and the active film 110 are formed on the substrate 100 (or the first etch blocking film 105). The first sacrificial film 130L and the active film 110 may be alternately stacked on the substrate 100 (or the first etch blocking film 105).

The active film 110 may include a two-dimensional semiconductor material. The two-dimensional semiconductor material may include, for example, but is not limited to, graphene, carbon nanotube, transition metal dichalcogenide (TMD) or combinations thereof.

The first sacrificial film 130L may include a material having an etching selectivity with respect to the active film 110 and/or the first sub-dielectric film 122. In an example, the first sacrificial film 130L may include, but is not limited to, silicon germanium (SiGe).

The first sub-dielectric film 122 may be interposed between the active film 110 and the first sacrificial film 130L. Such a first sub-dielectric film 122 may extend along the lower surface and the upper surface of the active film 110. Further, the first sub-dielectric film 122 may be interposed between the first etch blocking film 105 and the first sacrificial film 130L. The first sub-dielectric film 122 may include a dielectric material, for example, but is not limited to, at least one of silicon oxide, silicon oxynitride, silicon nitride or a high dielectric constant material having a higher dielectric constant than silicon oxide.

In an embodiment, after the first sub-dielectric film 122, the first sacrificial film 130L, and the active film 110 are formed, a selective growth process may be performed on the first sub-dielectric film 122. The first sub-dielectric film 122 grown by the selective deposition process may cover the side surfaces of the active film 110. As a result, as shown in FIG. 4, the first sub-dielectric film 122 that surrounds the periphery of the first active pattern AP1 may be formed.

Figure 19:
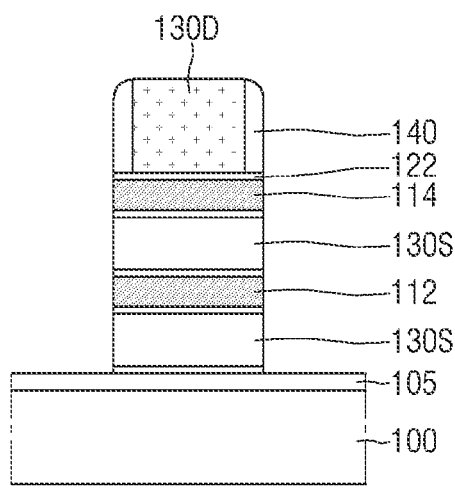

Referring to FIG. 19, a sacrificial pattern 130S and the sheet patterns 112 and 114 are formed.

For example, a dummy gate 130D extending in the second direction Y may be formed on the first sub-dielectric film 122, the first sacrificial film 130L, and the active film 110 of FIG. 18. Further, the first gate spacer 140 extending along the side surface of the dummy gate 130D may be formed on the first sub-dielectric film 122, the first sacrificial film 130L and the active film 110. After that, an etching process using the dummy gate 130D and the first gate spacer 140 as an etching mask may be performed. Therefore, the first sub-dielectric film 122, the first sacrificial film 130L, and the active film 110 may be patterned. The patterned first sacrificial film 130L may form a sacrificial pattern 130S extending in the first direction X, and the patterned active film 110 may form sheet patterns 112 and 114 each extending in the first direction X.

The dummy gate 130D may include a material having an etching selectivity with respect to the active film 110 and/or the first sub-dielectric film 122. In an example, the dummy gate 130D may include, but is not limited to, polysilicon (poly Si).

Figure 20:
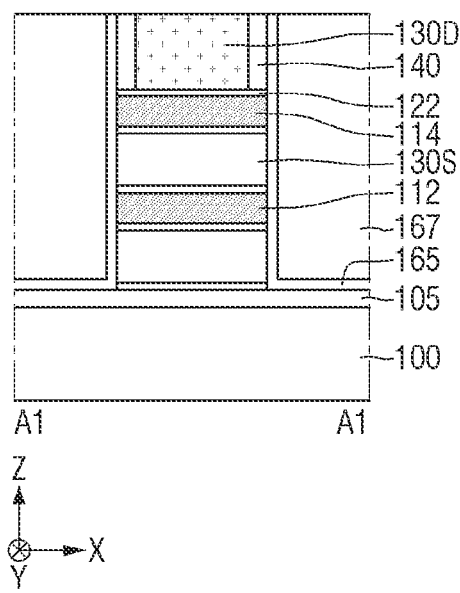

Referring to FIG. 20, a second sacrificial film 165 and a third sacrificial film 167 are formed on the substrate 100 (or the first etch blocking film 105).

The second sacrificial film 165 may extend along the outer surfaces of the sheet patterns 112 and 114, the outer surface of the first sub-dielectric film 122, and the outer surface of the first gate spacer 140. The second sacrificial film 165 may include, for example, but is not limited to, at least one of silicon nitride, silicon oxynitride, silicon oxycarbide, silicon boron nitride, silicon boron carbonitride, silicon oxycarbonitride, and combinations thereof. In some other embodiments, the second sacrificial film 165 may be omitted.

The third sacrificial film 167 may be stacked on the second sacrificial film 165. The third sacrificial film 167 may fill the region on the substrate 100 (or the first etch blocking film 105) that remains after the second sacrificial film 165 is formed. In an embodiment, the third sacrificial film 167 may include a material having an etching selectivity with respect to the second sacrificial film 165. As an example, the second sacrificial film 165 may include silicon nitride, and the third sacrificial film 167 may include silicon oxide.

Figure 21:
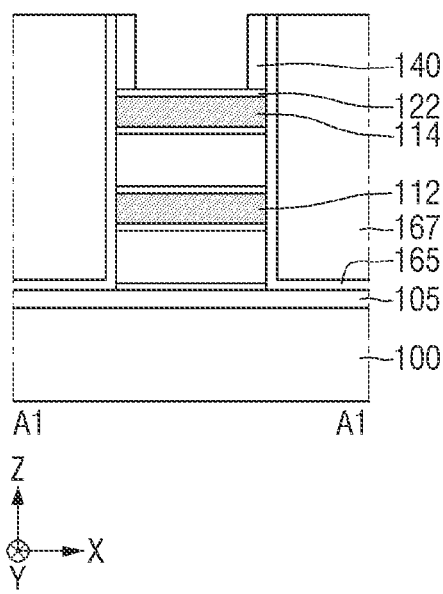

Referring to FIG. 21, the sacrificial pattern 130S and the dummy gate 130D are removed.

Since the sacrificial pattern 130S and the dummy gate 130D may include a material having an etching selectivity with respect to the active film 110 and/or the first sub-dielectric film 122, such material may be selectively removed.

Figure 22:
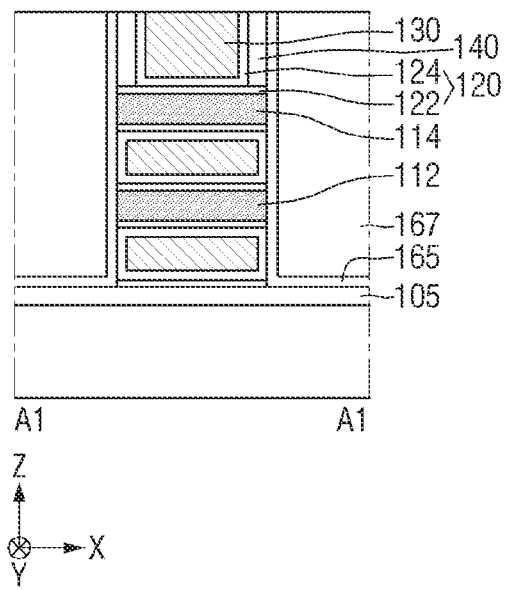

Referring to FIG. 22, the second sub-dielectric film 124 and the first gate electrode 130 are formed.

The second sub-dielectric film 124 may be sequentially stacked around the first sub-dielectric film 122 and on the inner surface of the first gate spacer 140. As a result, the first gate dielectric film 120 including the first sub-dielectric film 122 and the second sub-dielectric film 124 may be formed. The first sub-dielectric film 122 and the second sub-dielectric film 124 may include the same dielectric material as each other, or may include different dielectric materials from each other.

The first gate electrode 130 may be stacked on the second sub-dielectric film 124. The first gate electrode 130 may include a conductive material, for example, but is not limited to, at least one of TiN, WN, TaN, Ru, TiC, TaC, Ti, Ag, Al, TiAl, TiAlN, TiAlC, TaCN, TaSiN, Mn, Zr, W and combinations thereof.

The second sub-dielectric film 124 and the first gate electrode 130 may replace the dummy gate 130D and the sacrificial pattern 130S of FIG. 19. Accordingly, the first gate electrode 130 extending in the second direction Y, and the first active pattern AP1 extending in the first direction X and penetrating the first gate electrode 130 may be formed.

Figure 23:
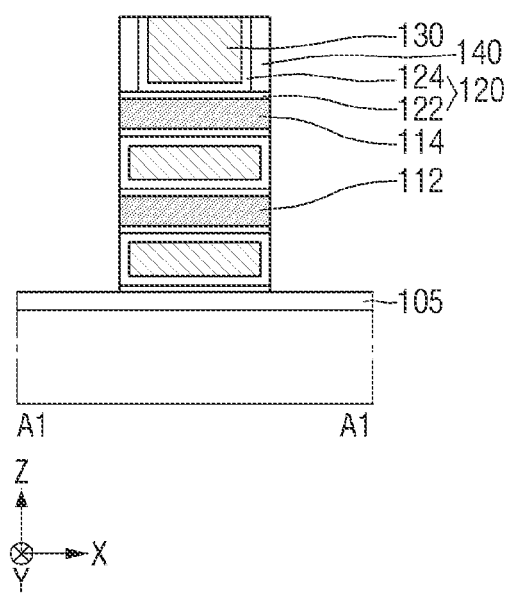

Referring to FIG. 23, the second sacrificial film 165 and the third sacrificial film 167 are removed.

In an embodiment, the second sacrificial film 165 and the third sacrificial film 167 may be removed in stages. For example, the third sacrificial film 167 may include a material having an etching selectivity with respect to the second sacrificial film 165, and thus may be selectively removed. The second sacrificial film 165 may be removed after the third sacrificial film 167 is removed.

Figure 24:
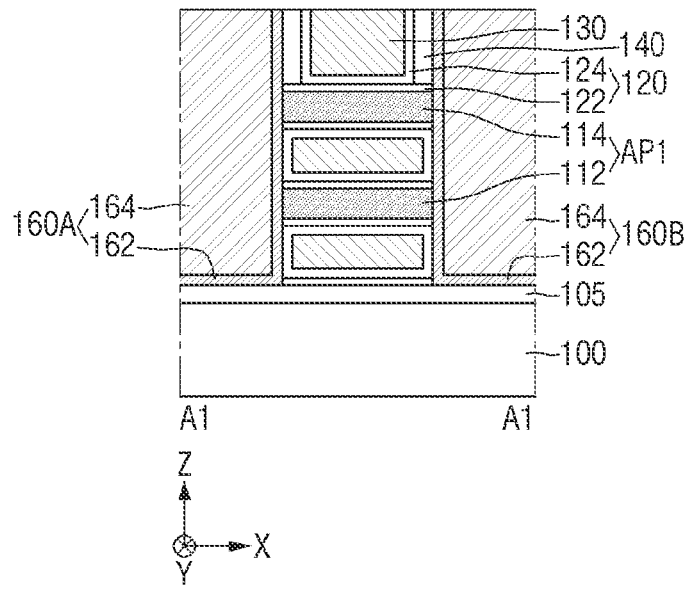

Referring to FIG. 24, the first contact insertion film 162 is formed on the upper surface of the substrate 100 (or the first etch blocking film 105) and the side surface of the first gate electrode 130.

The first contact insertion film 162 may be in direct contact with the end of the first active pattern AP1 to form an ohmic contact. The first contact insertion film 162 may include a semimetal material, for example, but is not limited to, arsenic (As), antimony (Sb), bismuth (Bi), tin (Sn), indium (In), ruthenium (Ru) or allotrope of carbon such as graphite.

Figure 25:
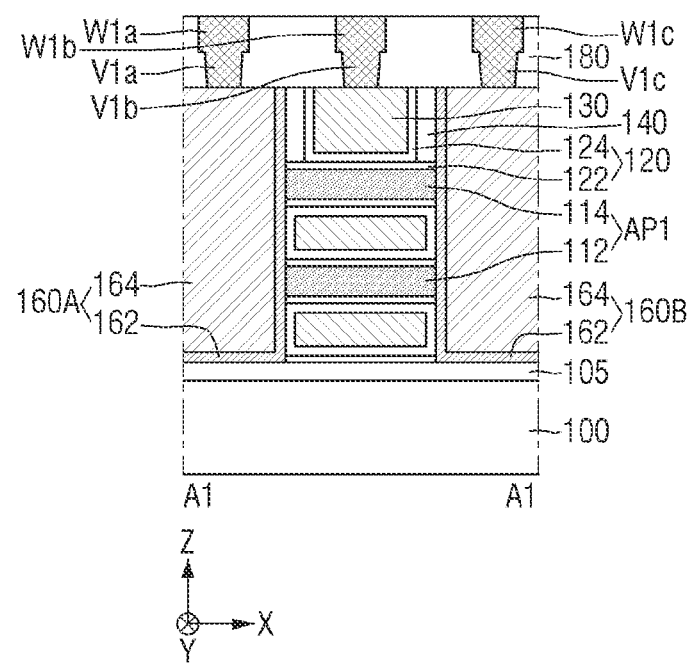

Referring to FIG. 25, the first wiring structure WS1 is formed on the first gate electrode 130 and the first source/drain contacts 160A and 160B.

The first wiring structure WS1 may be electrically connected to at least one of the first gate electrode 130 and the first source/drain contacts 160A and 160B. For example, the first wiring structure WS1 may include a first inter-wiring insulating film 180, and first wiring patterns W1a to W1c each extending in the second direction Y inside the first inter-wiring insulating film 180. The first wiring patterns W1a to W1c may be electrically connected to the first gate electrodes 130 and/or the first source/drain contacts 160A and 160B through the first via patterns V1a to V1c extending in the third direction Z inside the first inter-wiring insulating film 180.

Figure 26:
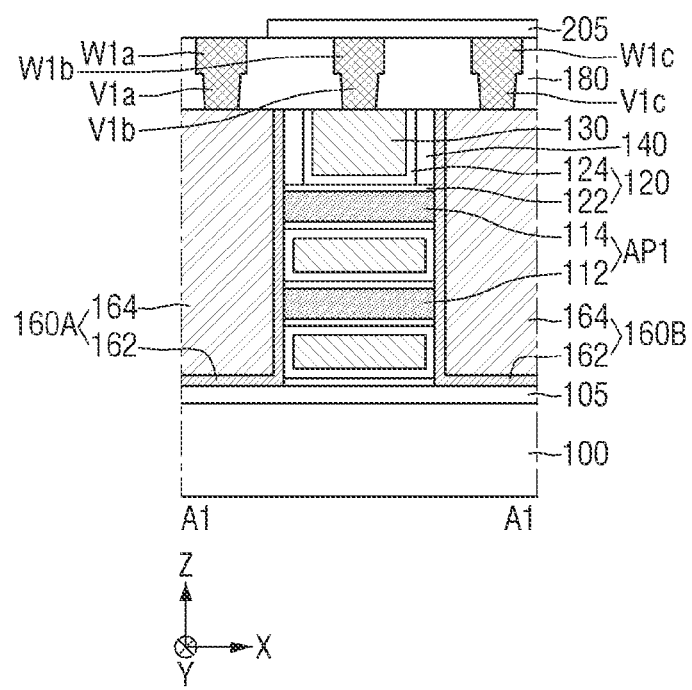

Referring to FIG. 26, the second etch blocking film 205 is formed on the first wiring structure WS1.

The second etch blocking film 205 may cover at least a part of the upper surface of the first wiring structure WS1. The second etch blocking film 205 may include an insulating material, for example, but is not limited to, at least one of silicon nitride, silicon oxynitride, silicon oxycarbide, silicon boron nitride, silicon boron carbonitride, silicon oxycarbonitride, and combinations thereof.

In an embodiment, the second etch blocking film 205 may expose a part of the upper surface of the first wiring structure WS1. For example, the second etch blocking film 205 may be patterned to expose a part of the upper surface of the first wiring structure WS1.

Figure 27:
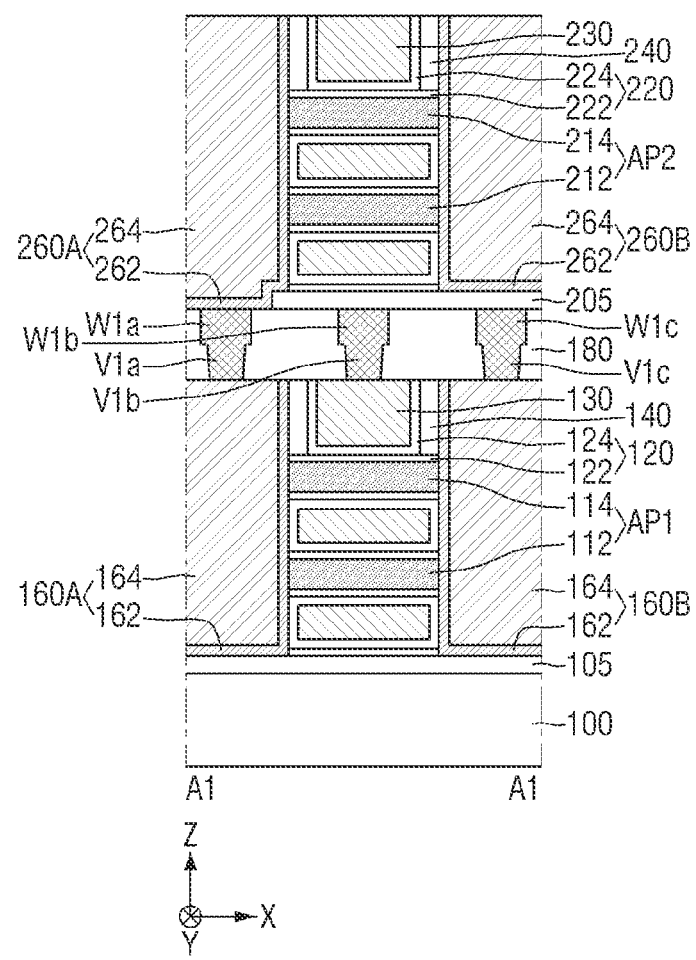

Referring to FIG. 27, a second active pattern AP2, a second gate dielectric film 220, a second gate electrode 230, a second gate spacer 240 and second source/drain contacts 260A and 260B are formed on the second etch blocking film 205.

Because the formation of the second active pattern AP2, the second gate dielectric film 220, the second gate electrode 230, the second gate spacer 240 and the second source/drain contacts 260A and 260B is similar to that described above using FIGS. 18 to 24, except for stacking on the second etch blocking film 205, substantially duplicate description thereof may be omitted below.

Next, referring to FIGS. 2 to 6, the second wiring structure $WS_2$ and the first through via V2d are formed on the second gate electrode 230 and the second source/drain contacts 260A and 260B. Since formation of the second wiring structure $WS_2$ is similar to that described above using FIG. 25, substantially duplicate description thereof may be omitted below. Therefore, the semiconductor device described above using FIGS. 2 to 6 may be fabricated.

Figure 28:
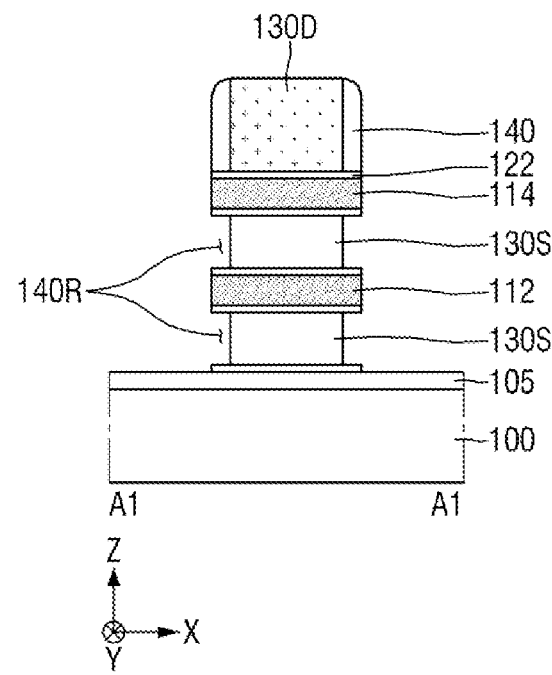
FIGS. 28 and 29 are intermediate step diagrams for explaining a method for fabricating a semiconductor device according to an embodiment.
Figure 29:
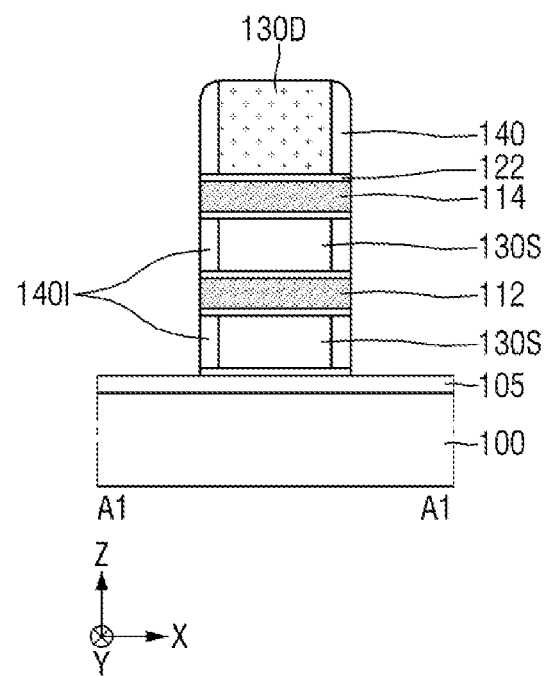

FIGS. 28 and 29 are intermediate step diagrams for explaining a method for fabricating a semiconductor device according to an embodiment. For convenience of explanation, repeated parts of contents explained above using FIGS. 1 to 27 may be briefly described or omitted. For reference, FIG. 28 is an intermediate step diagram for explaining a step after FIG. 19.

Referring to FIG. 28, a first recess process on the sacrificial pattern 130S is performed.

As the recess process is performed, the outer surface of the sacrificial pattern 130S may be selectively recessed. Therefore, the outer surface of the sacrificial pattern 130S may define a recess 140R that is recessed from the outer surfaces of the sheet patterns 112 and 114, the outer surface of the first sub-dielectric film 122, and/or the outer surface of the first gate spacer 140.

Referring to FIG. 29, a first internal spacer 1401 is formed.

The first internal spacer 1401 may fill the recess 140R of FIG. 28. Accordingly, the first internal spacer 1401 may be formed on the side surfaces of the first gate electrode 130 between the sheet patterns 112 and 114. Further, the first internal spacer 1401 may be formed on the side surfaces of the first gate electrode 130 between the first etch blocking film 105 and the sheet patterns 112 and 114.

The steps described above using FIGS. 20 to 27 may then be performed. The semiconductor device described above using FIG. 7 may be fabricated accordingly.

In concluding the detailed description, those of ordinary skill in the pertinent art shall appreciate that many variations and modifications may be made to the above-described and other embodiments without substantially departing from the principles of the present inventive concept. Therefore, the disclosed embodiments are used in a generic and descriptive sense and not for purposes of limitation.

What is claimed is:

1. A semiconductor device comprising:
   a substrate;
   a first transistor disposed on the substrate, the first transistor comprising a first active pattern including a first two-dimensional semiconductor material, a first gate electrode through which the first active pattern penetrates, and a first source/drain contact connected to the first active pattern on a side surface of the first gate electrode;
   a second transistor disposed on an upper surface of the first transistor, the second transistor comprising a second active pattern including a second two-dimensional semiconductor material, a second gate electrode through which the second active pattern penetrates, and a second source/drain contact connected to the second active pattern on a side surface of the second gate electrode; and
   a first wiring structure interposed between the first transistor and the second transistor, and electrically connecting the first transistor and the second transistor,
   wherein the first transistor and the second transistor have different conductive types from each other.

2. The semiconductor device of claim 1, wherein each of the first two-dimensional semiconductor material and the second two-dimensional semiconductor material includes at least one of graphene, carbon nanotube, and a transition metal dichalcogenide.

3. The semiconductor device of claim 1, further comprising:
   an etch blocking film which covers at least a part of an upper surface of the first wiring structure, between the first wiring structure and the second transistor,
   wherein the second source/drain contact penetrates the etch blocking film and is electrically connected to the first wiring structure.

4. The semiconductor device of claim 3, wherein the first wiring structure electrically connects the first source/drain contact and the second source/drain contact.

5. The semiconductor device of claim 1, further comprising:
   an etch blocking film which covers at least a part of the upper surface of the first wiring structure between the first wiring structure and the second transistor;
   a second wiring structure electrically connected to the second transistor, disposed on the second transistor; and
   a through via which penetrates the etch blocking film and electrically connects the first wiring structure and the second wiring structure.

6. The semiconductor device of claim 1, wherein the first source/drain contact includes a first contact insertion film extending along a side surface of the first active pattern and the side surface of the first gate electrode, and a first filling metal film stacked on the first contact insertion film,
   wherein the second source/drain contact includes a second contact insertion film extending along a side surface of the second active pattern and the side surface of the second gate electrode, and a second filling metal film stacked on the second contact insertion film.

7. The semiconductor device of claim 6, wherein the first contact insertion film forms an ohmic contact with the first active pattern, and
   the second contact insertion film forms an ohmic contact with the second active pattern.

8. A semiconductor device comprising:
   a substrate;
   a first etch blocking film which covers an upper surface of the substrate;
   a first transistor disposed on the first etch blocking film;
   a first wiring structure electrically connected to the first transistor, disposed on the first transistor;
   a second etch blocking film which covers at least a part of an upper surface of the first wiring structure;
   a second transistor having a conductive type different from that of the first transistor, disposed on the second etch blocking film;
   a second wiring structure electrically connected to the second transistor, disposed on the second transistor; and
   a through via which penetrates the second etch blocking film and electrically connects the first wiring structure and the second wiring structure,
   wherein the first transistor comprises a first active pattern including a first two-dimensional semiconductor material, a first gate electrode through which the first active pattern penetrates, and a first contact and a second contact each connected to both ends of the first active patterns on both side surfaces of the first gate electrode, and
   wherein the second transistor comprises a second active pattern including a second two-dimensional semiconductor material, a second gate electrode through which the second active pattern penetrates, and a third contact and a fourth contact each connected to both ends of the second active pattern on both side surfaces of the second gate electrode.

9. The semiconductor device of claim 8, wherein the first wiring structure includes a first inter-wiring insulating film that covers an upper surface of the first transistor, a first wiring in the first inter-wiring insulating film, and a first via which connects the first wiring and the first gate electrode inside the first inter-wiring insulating film, the second wiring structure includes a second inter-wiring insulating film that covers an upper surface of the second transistor, a second wiring in the second inter-wiring insulating film, and a second via which connects the second wiring and the second gate electrode inside the second inter-wiring insulating film, and the through via connects the first wiring and the second wiring.

10. The semiconductor device of claim 8, wherein the third contact penetrates the second etch blocking film and is electrically connected to the first wiring structure.

11. The semiconductor device of claim 10, wherein the first wiring structure electrically connects the first contact and the third contact.

12. The semiconductor device of claim 8, wherein the fourth contact is separated from the first wiring structure by the second etch blocking film.

13. The semiconductor device of claim 12, wherein different power supply voltages are applied to the second contact and the fourth contact.

14. A semiconductor device comprising:
a substrate;
a first CMOS circuit which is sequentially stacked on the substrate, and includes a first transistor and a second transistor having different conductive types from each other; and
a second CMOS circuit which is sequentially stacked on the first CMOS circuit, and includes a third transistor and a fourth transistor having different conductive types from each other,
wherein each of the first to fourth transistors has an active pattern including a two-dimensional semiconductor material, a gate electrode through which the active pattern penetrates, and a first source/drain contact and a second source/drain contact each connected to both ends of the active pattern on both side surfaces of the gate electrode, and
wherein the first CMOS circuit and the second CMOS circuit are electrically connected.

15. The semiconductor device of claim 14, further comprising:
a first wiring structure which is electrically connected to the first transistor, between the first transistor and the second transistor;
a second wiring structure which is electrically connected to the second transistor, between the second transistor and the third transistor;
a third wiring structure which is electrically connected to the third transistor, between the third transistor and the fourth transistor; and
a fourth wiring structure which is electrically connected to the fourth transistor, disposed on an upper surface of the fourth transistor.

16. The semiconductor device of claim 15, further comprising:
a first through via which connects the first wiring structure and the second wiring structure; and
a second through via which connects the third wiring structure and the fourth wiring structure,
wherein the gate electrode of the first transistor and the gate electrode of the second transistor are connected to each other by the first through via, and
wherein the gate electrode of the third transistor and the gate electrode of the fourth transistor are connected to each other by the second through via.

17. The semiconductor device of claim 15, further comprising:
a through via which connects the second wiring structure and the third wiring structure,
wherein the first source/drain contact of the second transistor and the gate electrode of the third transistor are connected to each other by the through via.

18. The semiconductor device of claim 15, further comprising:
a first through via which connects the first wiring structure and the third wiring structure; and
a second through via which connects the second wiring structure and the fourth wiring structure,
wherein the second source/drain contact of the first transistor and the second source/drain contact of the third transistor are connected to each other by the first through via, and
wherein the second source/drain contact of the second transistor and the second source/drain contact of the fourth transistor are connected to each other by the second through via.

19. The semiconductor device of claim 14, wherein the first CMOS circuit forms a first inverter,
wherein the second CMOS circuit forms the second inverter, and
wherein an output of the first inverter is provided as an input of the second inverter.

* * * * *